(12) United States Patent
Lee et al.

(10) Patent No.: US 12,340,719 B2
(45) Date of Patent: *Jun. 24, 2025

(54) CHIP-ON-FILM PACKAGE, DISPLAY PANEL, AND DISPLAY DEVICE

(71) Applicant: Samsung Display Co., Ltd., Yongin-Si (KR)

(72) Inventors: Hee-Kwon Lee, Asan-si (KR); Seungkyun Hong, Cheonan-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/241,712

(22) Filed: Sep. 1, 2023

(65) Prior Publication Data

US 2023/0410703 A1 Dec. 21, 2023

Related U.S. Application Data

(63) Continuation of application No. 17/367,574, filed on Jul. 5, 2021, now Pat. No. 11,749,146, which is a
(Continued)

(30) Foreign Application Priority Data

Feb. 10, 2017 (KR) .................. 10-2017-0018734

(51) Int. Cl.
*G09G 3/00* (2006.01)
*G02F 1/1345* (2006.01)
(Continued)

(52) U.S. Cl.
CPC ......... *G09G 3/006* (2013.01); *G02F 1/13452* (2013.01); *G09G 3/20* (2013.01);
(Continued)

(58) Field of Classification Search
CPC .. G09G 3/006; G09G 3/20; G09G 2300/0413; G09G 2300/0426;
(Continued)

(56) References Cited

U.S. PATENT DOCUMENTS 6,414,741 B2    7/2002  Hasegawa et al.
9,201,549 B2 *  12/2015  Al-Dahle .............. G06F 3/044
(Continued)

FOREIGN PATENT DOCUMENTS

JP       06250199 A    9/1994
JP    2001318620 A   11/2001
(Continued)

OTHER PUBLICATIONS

Japanese Office Action for Application No. 2018-014380 dated Nov. 30, 2021 enumerating the above listed references.
Taiwanese Office Action for Application No. 107104778 dated Jul. 2, 2021 enumerating the above listed references.
(Continued)

*Primary Examiner* — Mohammed Shamsuzzaman
(74) *Attorney, Agent, or Firm* — CANTOR COLBURN LLP

(57) ABSTRACT

A chip-on-film package includes a base substrate on which a first pad region, a second pad region, and a third region located between the first pad region and the second pad region are defined, a dummy pad disposed on the first pad region, input pads disposed on the first pad region, output pads disposed on the second region, a first detection line disposed on the base substrate, and a second detection line disposed on the base substrate. The first detection line is connected to a first input pad and a second input pad via the second pad region to form a first loop between the first input pad and the second input pad, and the second detection line is connected to the dummy pad and the first detection line via the third region to form a second loop between the dummy pad and the first input pad.

15 Claims, 18 Drawing Sheets

Related U.S. Application Data continuation of application No. 16/692,122, filed on Nov. 22, 2019, now Pat. No. 11,056,027, which is a continuation of application No. 15/857,744, filed on Dec. 29, 2017, now Pat. No. 10,504,830.

(51) Int. Cl.
| | | |
|---|---|---|
| *G09G 3/20* | (2006.01) | |
| *H01L 23/31* | (2006.01) | |
| *H01L 23/482* | (2006.01) | |
| *H01L 23/498* | (2006.01) | |
| *H05K 1/02* | (2006.01) | |
| *H05K 1/18* | (2006.01) | |

(52) U.S. Cl.
CPC ...... *H01L 23/3114* (2013.01); *H01L 23/4824* (2013.01); *H01L 23/4985* (2013.01); *H05K 1/0268* (2013.01); *G09G 2300/0413* (2013.01); *G09G 2300/0426* (2013.01); *G09G 2330/12* (2013.01); *H05K 1/028* (2013.01); *H05K 1/189* (2013.01); *H05K 2201/10128* (2013.01)

(58) Field of Classification Search
CPC ............ G09G 2330/12; G02F 1/13452; G02F 1/1345; H01L 23/3114; H01L 23/4824; H01L 23/4985; H01L 22/12; H01L 22/14; H01L 22/32; H01L 22/34; H01L 25/0655; H01L 23/522; H01L 24/20; H01L 25/0652; H01L 25/16; H01L 25/18; H05K 1/0268; H05K 1/028; H05K 1/189; H05K 2201/10128; G01R 31/2836
See application file for complete search history.

(56) References Cited

U.S. PATENT DOCUMENTS

| | | | | |
|---|---|---|---|---|
| 9,747,825 | B2* | 8/2017 | Kim | H10K 71/70 |
| 2006/0081968 | A1* | 4/2006 | Bai | H01L 23/62 |
| | | | | 257/E23.07 |
| 2006/0284821 | A1* | 12/2006 | Takenaka | G09G 3/006 |
| | | | | 345/100 |
| 2007/0182440 | A1 | 8/2007 | Cha | |
| 2009/0231823 | A1* | 9/2009 | Kunimatsu | H05K 1/111 |
| | | | | 361/783 |
| 2011/0037158 | A1* | 2/2011 | Youn | H01L 24/33 |
| | | | | 257/692 |
| 2012/0061669 | A1 | 3/2012 | Kim et al. | |
| 2012/0080806 | A1* | 4/2012 | Song | H01L 22/32 |
| | | | | 257/E23.024 |
| 2012/0086679 | A1 | 4/2012 | Hwang et al. | |
| 2013/0082843 | A1* | 4/2013 | Wurzel | G06F 1/1601 |
| | | | | 324/525 |
| 2013/0307833 | A1 | 11/2013 | Lee et al. | |
| 2014/0319523 | A1* | 10/2014 | Lee | H05K 1/0268 |
| | | | | 257/48 |

FOREIGN PATENT DOCUMENTS

| | | |
|---|---|---|
| JP | 2009282285 A | 12/2009 |
| KR | 1020160096739 A | 8/2016 |
| TW | 201000992 | 6/1997 |
| TW | 201001428 | 6/1997 |
| TW | 201349479 | 12/2013 |

OTHER PUBLICATIONS

Extended European Search Report -European Patent Application No. 18155800.8 dated Jun. 22, 2018, citing references listed within.

* cited by examiner

CHIP-ON-FILM PACKAGE, DISPLAY PANEL, AND DISPLAY DEVICE

This application is a continuation application of U.S. application Ser. No. 17/367,574, filed on Jul. 5, 2021, which is a continuation application of U.S. application Ser. No. 16/692,122, filed on Nov. 22, 2019, which is a continuation application of U.S. application Ser. No. 15/857,744, filed on Dec. 29, 2017, which claims priority to Korean patent Application No. 10-2017-0018734, filed on Feb. 10, 2017, and all the benefits accruing therefrom under 35 U.S.C. § 119, the content of which in its entirety is herein incorporated by reference.

BACKGROUND

1. Field

Exemplary embodiments of the invention relate to display devices. More particularly, exemplary embodiments of the invention relate to a chip-on-film ("COF") package, a display panel, and a display device capable of detecting internal damages.

2. Description of the Related Art

The display device typically includes a display panel, a printed circuit board ("PCB") for driving the display panel, and a COF package that electrically connects the display panel to the PCB.

One terminal of the COF package may be attached to a top surface of the display panel, and the COF package may be bent to face a bottom surface of the display panel. When the bending region of the COF package is bent exceeding the limit radius of curvature or the COF package is under a bending stress, the crack may occur in the bending region of the COF package. When a crack occurs in the bending region of the COF package, the display quality of the display device may decrease because of defects of the COF package or signal lines.

SUMMARY

Exemplary embodiments provide a chip-on-film ("COF") package capable of detecting a location and cause of an internal damage as well as detecting an occurrence of an internal damage using a simple detection structure.

Exemplary embodiments provide a display panel capable of detecting a location of the internal damage with a simple detection structure.

Exemplary embodiments provide a display device capable of monitoring the internal damage while the display device is normally driven.

According to some exemplary embodiments, the COF package may include a base substrate on which a first pad region, a second pad region different from the first pad region, and a third region located between the first pad region and the second pad region are defined, a dummy pad disposed on the first pad region, a plurality of input pads disposed on the first pad region, a plurality of output pads disposed on the second pad region, a first detection line disposed on the base substrate, and a second detection line disposed on the base substrate. In such embodiments, the first detection line is connected to a first input pad of the input pads and a second input pad of the input pads via the second pad region to form a first loop between the first input pad and the second input pad, and the second detection line is connected to the dummy pad and the first detection line via the third region to form a second loop between the dummy pad and the first input pad.

In exemplary embodiments, the dummy pad may include an alignment key for alignment of the input pads.

In exemplary embodiments, the first detection line may include a first sub-detection line connected to the first input pad and a first output pad of the output pads, and a second sub-detection line connected to the second input pad and a second output pad of the output pads. In such embodiments, the second detection line may be connected to the first sub-detection line.

In exemplary embodiments, the base substrate may include a plurality of layers, and the second detection line may be disposed on the plurality of layers.

In exemplary embodiments, the second detection line may include a first partial detection line and a second partial detection line. In such embodiments, the first partial detection line may be disposed on a first surface of the base substrate, the second partial detection line may be disposed on a second surface of the base substrate opposite to the first surface, and the first partial detection line may be connected to the second partial detection line via a via structure disposed through the base substrate.

In exemplary embodiments, the second detection line may include a detection pattern disposed on the third region in a zigzag pattern.

In exemplary embodiments, the dummy pad may be located in outermost among the input pads and the dummy pad disposed on the first pad region.

In exemplary embodiments, the COF package may further include an integrated circuit ("IC") chip and connected to the dummy pad and the input pads. In such embodiments, the IC chip may calculate a first resistance value of the first loop and a second resistance value of the second loop and determine whether at least one of the second pad region and the third region is damaged based on the first resistance value and the second resistance value.

In exemplary embodiments, the IC chip may determine whether the second pad region and the third region are damaged based on an input pad resistance value of the input pads and the first resistance value, the IC chip may determine whether the third region is damaged based on the input pad resistance value and the second resistance value, and the IC chip may determine whether the second pad region is damaged based on a difference value between the first resistance value and the second resistance value.

In exemplary embodiments, the COF package may further include a dummy line disposed on the based substrate. In such embodiments, the dummy line may extend from one side of the base substrate corresponding to the second pad region to another side of the base substrate across the base substrate, and the second detection line may be defined by at least a portion of the dummy line.

In exemplary embodiments, the second pad region may include a first sub-pad region and a second sub-pad region. In such embodiments, the output pads may include a plurality of first output pads disposed on the first sub-pad region and a plurality of second output pads disposed on the second sub-pad region. In such embodiments, the first loop may include a first sub-loop and a second sub-loop. In such embodiments, the first sub-loop may connect the first input pad to the second input pad via the first sub-pad region, and the second sub-loop may connect the second input pad to a third input pad of the input pads via the second sub-pad region.

In exemplary embodiments, the first detection line may include a first sub-detection line connected to the first input pad and a first output pad of the first output pads, a second sub-detection line connected to the second input pad and a second output pad of the second output pads, a third sub-detection line connected to the second input pad and a third output pad of the first output pads, and a fourth sub-detection line connected to the third input pad and a fourth output pad of the second output pads. In such embodiments, the second detection line may be connected to the first sub-detection line.

In exemplary embodiments, the COF package may further include a third detection line connected to the third input pad and a fourth input pad of the input pads to form a third loop.

In exemplary embodiments, the COF package may further include an IC chip connected to the dummy pad and the input pads. In such embodiments, the IC chip may calculate a first resistance value of the first loop, a second resistance value of the second loop, and a third resistance value of the third loop and determine whether at least one of the first pad region, the second pad region and the third region is damaged based on the first resistance value, the second resistance value and the third resistance value.

In exemplary embodiments, the IC chip may determine whether the input pads, the output pads, and the third region are damaged based on the third resistance value, determine whether the input pads are damaged based on the third resistance value, determine whether the output pads are damaged based on a difference value between the first resistance value and the second resistance value, and determine whether the third region is damaged based on a difference value between the second resistance value and the third resistance value.

According to some exemplary embodiments, a display panel may include a base substrate on which a first pad region and a second region different from the first pad region are defined, a dummy pad disposed on the first pad region, a plurality of pads disposed on the first pad region, a first detection line disposed on the base substrate, and a second detection line disposed on the base substrate. In such embodiments, the first detection line is connected to a first pad of the pads and a second pad of the pads via at least a peripheral portion of the base substrate to form a first loop between the first pad and the second pad, and the second detection line is connected to the dummy pad and the first detection line via the second region to form a second loop between the dummy pad and the first pad.

In exemplary embodiments, the dummy pad may include an alignment key for alignment of the pads.

In exemplary embodiments, the base substrate may include a plurality of layers. The second detection line may pass through the plurality of layers.

In exemplary embodiments, the second detection line may include a detection pattern disposed on the second region in a zigzag pattern.

According to some exemplary embodiments, a display device may include a display panel which displays an image, a printed circuit board ("PCB") which drives the display panel, a COF package which electrically connects the display panel to the printed circuit board. In such embodiments, the display panel or the COF package may include a base substrate on which a first pad region and a second region different from the first pad region are defined, a dummy pad disposed on the first pad region, a plurality of pads disposed on the first pad region, a first detection line disposed on the base substrate, and a second detection line disposed on the base substrate. In such embodiments, the first detection line is connected to a first pad of the pads and a second pad of the pads via at least a peripheral portion of the base substrate to form a first loop between the first pad and the second pad, the second detection line is connected to the dummy pad and the first detection line via the second region to form a second loop between the dummy pad and the first pad.

According to some exemplary embodiments, a chip-on-film package may include a base substrate on which a first pad region, a second pad region different from the first pad region, and a third region located between the first pad region and the second pad region are defined, a dummy pad disposed on the first pad region, a plurality of input pads disposed on the first pad region, a plurality of output pads disposed on the second pad region, a first detection line disposed on the base substrate, the first detection line connecting a first input pad of the input pads to a second input pad of the input pads via the second pad region and the third region, and a second detection line disposed on the base substrate, the second detection line connecting the dummy pad to the first detection line via the third region.

In exemplary embodiments, the first detection line may include a first sub-detection line and a second sub-detection line connected to the first sub-detection line in the second region. The first sub-detection line may connect a first input pad of the input pads to a first output pad of the output pads. The second sub-detection line may connect a second input pad of the input pads and a second output pad of the output pads.

In exemplary embodiments, the second detection line may be connected to the first sub-detection line.

In exemplary embodiments, the chip-on-film package may further include an inspection circuit is connected to the dummy pad and the input pads. The inspection circuit may calculate a first resistance value between the first input pad and the second input pad and a second resistance value between the dummy pad and the first input pad, and the inspection circuit determines whether at least one of the second pad region and the third region is damaged based on the first resistance value and the second resistance value.

In exemplary embodiments, the inspection circuit may determine whether the second pad region and the third region are damaged based on an input pad resistance value of the input pads and the first resistance value. The inspection circuit may determine whether the third region is damaged based on the input pad resistance value and the second resistance value. The inspection circuit may determine whether the second pad region is damaged based on a difference value between the first resistance value and the second resistance value.

In such an embodiment, a COF package includes the first detection line in a way such that an external inspection device may quickly determine whether or not the COF package is damaged.

In such an embodiment, the COF package includes the second detection line disposed on the bending region in a way such that that the external inspection device may determine a location and cause of the damage more quickly and accurately.

In such an embodiment, the COF package includes the dummy pad that has an alignment key to detect or analyze a location and cause of an internal damage without additional structure or elements.

An exemplary embodiment of a display panel includes the first detection line and the second detection line disposed on the bending region in a way such that the external inspection device may quickly determine whether or not the display panel is damaged.

An exemplary embodiment of a display device includes the first detection line, the second detection line, and the IC chip connected to the first and second detection lines, thereby continuously detecting or monitoring whether or not the internal damage in the display panel occurs.

BRIEF DESCRIPTION OF THE DRAWINGS

Exemplary embodiments will be described more fully hereinafter with reference to the accompanying drawings, in which various embodiments are shown.

DESCRIPTION

Figure 1:
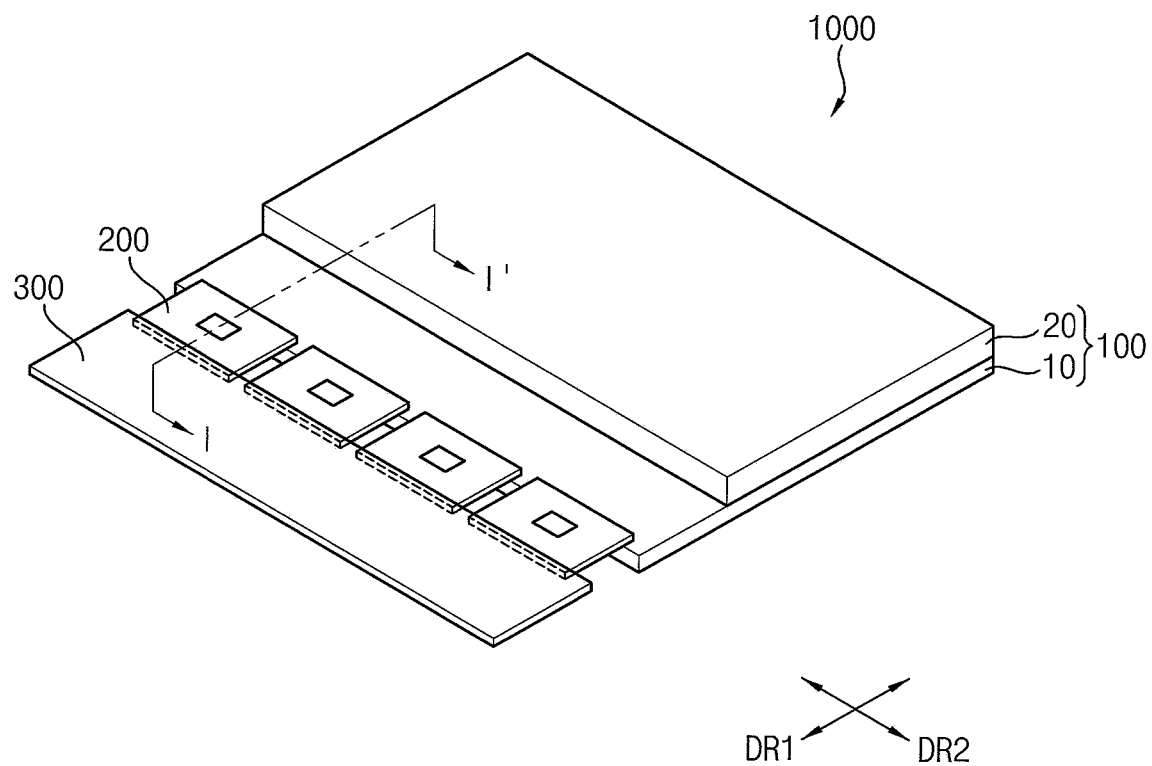
FIG. 1 is a diagram illustrating a display device according to an example embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Exemplary embodiments will be described more fully hereinafter with reference to the accompanying drawings, in which various embodiments are shown.

Figure 2:
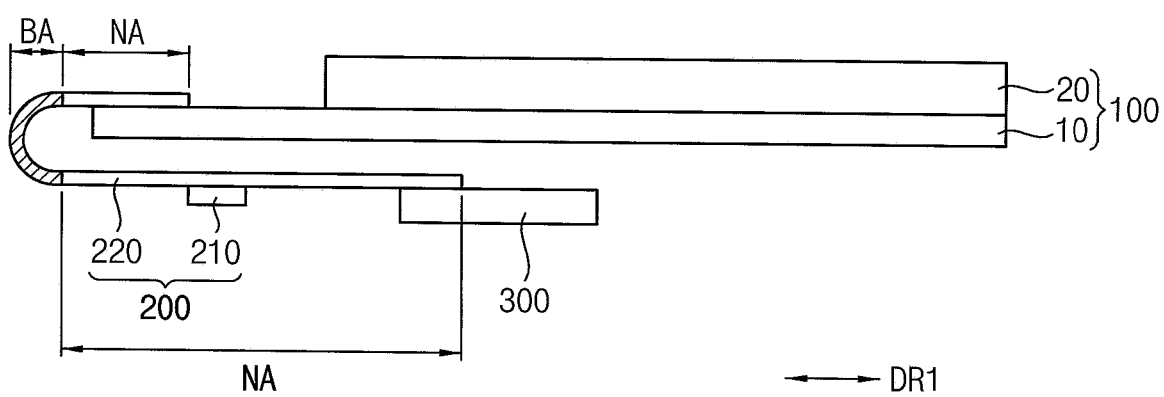
FIG. 2 is a cross-sectional diagram illustrating an exemplary embodiment of the display device of FIG. 1.

FIG. 1 is a diagram illustrating a display device according to an exemplary embodiment. FIG. 2 is a cross-sectional diagram illustrating an exemplary embodiment of the display device of FIG. 1.

Referring to FIGS. 1 and 2, an exemplary embodiment of the display device 1000 may include a display panel 100, a chip-on-film ("COF") package 200, and a printed circuit board ("PCB") 300.

The display panel 100 may be one of various display panels such as an organic light emitting display panel, a liquid crystal display panel, a plasma display panel, an electrophoretic display panel and an electrowetting display panel, for example. Hereinafter, for convenience of description, exemplary embodiments where the display panel 100 is the organic light emitting display panel will be described in detail.

The display panel 100 may display an image. The display panel 100 may include a first substrate 10 and a second substrate 20.

The first substrate 10 may include a plurality of pixels arranged in a matrix form in a display region (or an active region). The first substrate 10 may further include a gate driver (not shown) and a data driver (not shown) for driving the pixels. The first substrate 10 may have a relatively large sizer or scale in comparison with the second substrate 20 in a plan view, e.g., when viewed from a top plan view. A plurality of pads (or pad electrodes) may be disposed on a portion of the first substrate 10 which does not overlap the second substrate 20. The pads may be electrically connected to the gate driver and the data driver in a way such that signals applied to the pads are transferred to the gate driver and the data driver.

The second substrate 20 may be attached to the first substrate 10 to encapsulate pixels, circuits and wires that are disposed on the first substrate 10. The display panel 100 may further include a polarizing film attached to one surface of the second substrate 20 to prevent reflection of external light.

The COF package 200 may electrically connect the display panel 100 to the PCB 300. The COF package 200 may include a base substrate 220 (or a base film, a flexible substrate) and an integrated circuit ("IC") chip 210. Here, as shown in FIG. 2, the IC chip 210 may be mounted on an upper surface of the base substrate 220. Hereinafter, the upper surface of the COF package 200 or the upper surface of the base substrate 220 is defined as a surface on which the IC chip 210 is mounted or attached. Also, the lower surface of the COF package 200 or the lower surface of the base substrate 220 is defined as a surface on which the IC chip 210 is neither mounted nor attached.

In an exemplary embodiment, an end of the COF package 200 may be bonded to the pads of the display panel 100 to be electrically connected to the display panel 100. In such an embodiment, an opposing end of the COF package 200 may be bonded to the PCB 300 to be electrically connected the PCB 300. The COF package 200 may be disposed or mounted on the display panel 100 in a bent state (e.g., in a C-like shape). In one exemplary embodiment, for example, the display panel 100 may be connected to the lower surface of the base substrate 220 at the end of the COF package 200. The PCB 300 may be connected to the upper surface of the base substrate 220 at the opposing end of the COF package 200.

In an exemplary embodiment, as shown in FIG. 2, the display device 1000 may include 4 COF packages that are spaced apart from each other in the second direction DR2, but the number of the COF packages is not limited thereto. In one exemplary embodiment, for example, the number of the COF packages included in the display device 1000 may be variously modified.

The PCB 300 may include a driving substrate and a plurality of circuits for driving the display panel 100. When the COF package 200 is bent and is bonded to the first substrate 10, the PCB 300 may be located below the first substrate 10.

Although not shown in FIG. 1, in an exemplary embodiment, the display device 1000 may further include a case, and in such an embodiment, the display panel 100, the COF package 200, and the PCB 300 may be housed in the case.

Figure 3A:
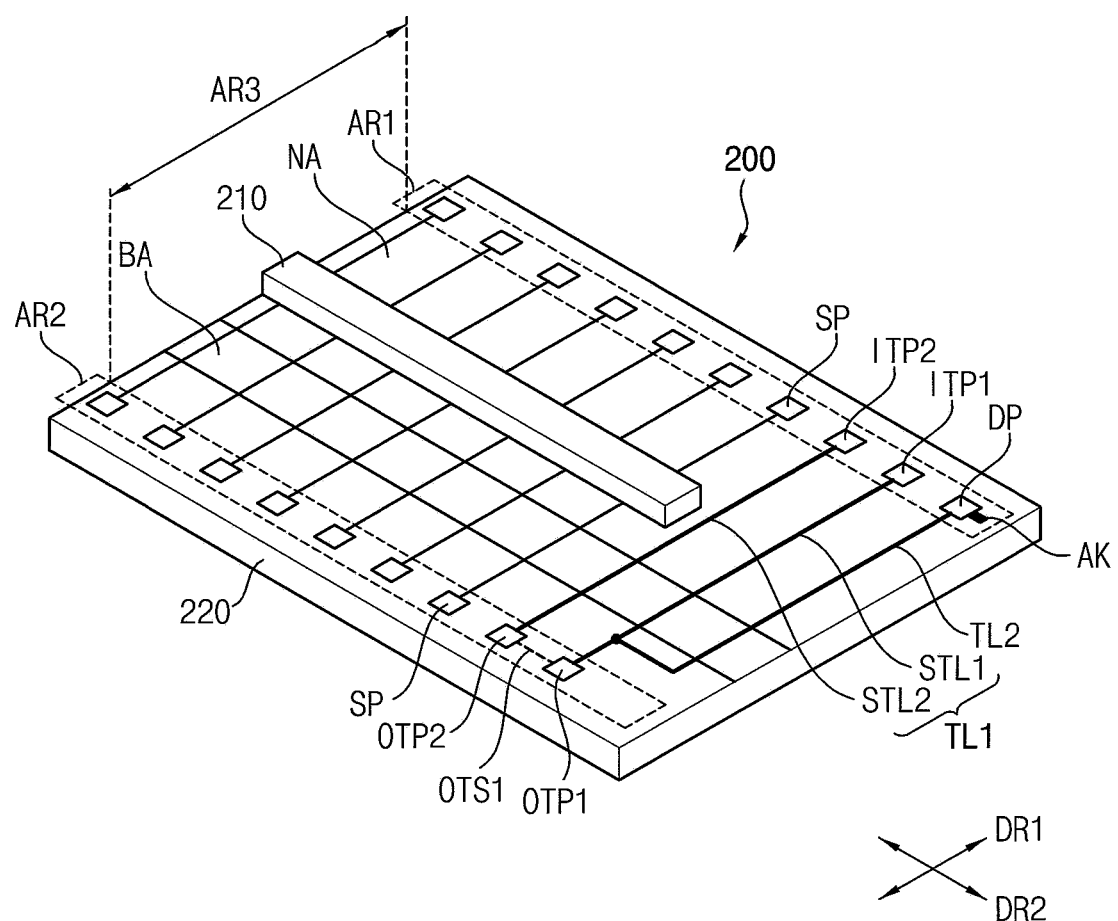
FIG. 3A is a diagram illustrating exemplary embodiment of a COF package included in a display device of FIG. 1.

FIG. 3A is a diagram illustrating an exemplary embodiment of a COF package included in a display device of FIG. 1.

Referring to FIGS. 1, 2 and 3A, an exemplary embodiment of the COF package 200 may include a base substrate 220, a plurality of pads (or a plurality of pad terminals), an IC chip 210, a first detection line TL1, and a second detection line TL2.

When viewed from a plan view, the COF package 200 may include a bending region BA and a non-bending region NA. The COF package 200 may be bent in the bending region BA. The bending region BA may have a constant width in the first direction DR1 and may extend in the second direction DR2. The COF package 200 may not be bent in the non-bending region NA even if the COF package 200 is bent in the bending region BA. Thus, the non-bending region NA may be defined by a remaining region excluding the bending region BA in the base substrate 220.

The non-bending region NA may include a first pad region AR1 (or a first bonding region, an input outer lead bonding region), and a second pad region AR2 (or a second bonding region, an output outer lead bonding region). The first pad region AR1 may be a region to be bonded to the PCB 300 and may include a plurality of input pads ITP1, ITP2, a dummy pad DP, and a plurality of signal pads SP. The second pad region AR2 may be a region to be bonded to the display panel 100 and may include a plurality of output pads OTP1, OTP2 and a plurality of signal pads SP. In an exemplary embodiment, as shown in FIG. 3A, the first pad region AR1 and the second pad region AR2 may be defined in opposing regions, respectively. The first pad region AR1 may extend in the second direction DR2 and be located at one end (or adjacent to one end) of the COF package 200 in the first direction DR1. The second pad region AR2 may extend in the second direction DR2 and be located at the other end (or adjacent to the opposing end) of the COF package 200 in the first direction DR1.

The first pad region AR1 and the second pad region AR2 may be spaced from the bending region BA. A third region AR3 may be located between the first pad region AR1 and the second pad region AR2. The bending region BA may be included in the third region AR3. The bending region BA may be located between the first pad region AR1 and the IC chip 210 or between the second pad region AR2 and the IC chip 210. In an exemplary embodiment, as shown in FIG. 3, the bending region BA may be located between the second pad region AR2 and the IC chip 210.

The base substrate 220 may be a flexible film. The base substrate 220 may include upper surface and lower surface opposite to the upper surface. The IC chip 210 may be disposed on the upper surface of the base substrate 220. The IC chip 210 may include a plurality of terminals and may be electrically connected to signal pads SP through signal lines.

In an exemplary embodiment, the first detection line TL1 may be disposed on the base substrate 220 and may be connected to the first input pad ITP1 and the second input pad ITP2. The first detection line TL1 may form a first loop between the first input pad ITP1 and the second input pad ITP2 via the second pad region AR2. Here, the loop represents an electric circuit through which a signal can circulate. For example, the second input pad ITP2 receives a feedback signal based on a signal applied to the first input pad ITP1 through the first loop between first input pad ITP1 and the second input pad ITP2

In an exemplary embodiment, the first detection line TL1 may include a first sub-detection line STL1 and a second sub-detection line STL2. The first sub-detection line STL1 may connect the first input pad ITP1 to the first output pad OTP1, and the second sub-detection line STL2 may connect the second input pad ITP2 to the second output pad OTP2. The first sub-detection line STL1 and the second sub-detection line STL2 may be spaced apart from each other in the second direction DR2. Each of the first sub-detection line STL1 and the second sub-detection line STL2 may extend in the first direction DR1 and may be a substantially straight line. The first sub-detection line STL1 and the second sub-detection line STL2 may be interconnected in the second pad region AR2 through a first short pad OTS1. In such an embodiment, the first short pad OTS1 may be included in the display panel 100 and may be located in correspondence with a line connecting the first output pad OTP1 and the second output pad OTP2 in the first substrate 10. When the COF package 200 is bonded to the display panel 100, the first short pad OTS1 connects the first output pad OTP1 and the second output pad OTP2 at the shortest distance.

For reference, an inspection process for determining whether or not the COF package 200 is damaged may be performed using an inspection device (inspection circuit, or IC chip). For example, the inspection process may be performed using the external or internal inspection device during the manufacturing process of the display device 1000. In the inspection process, the inspection device may be connected to the first input pad ITP1 and the second input pad ITP2. The inspection device may apply a test signal to one (e.g., the first input pad ITP1) of the first input pad ITP1 and the second input pad ITP2, receive a first measured signal from the other one (e.g., the second input pad ITP2) of the first input pad ITP1 and the second input pad ITP2, and determine whether or not the COF package 200 is damaged based on the test signal and the first measured signal. In the inspection process, the inspection device may apply a first test voltage between the first input pad ITP1 and the second input pad ITP2, receive the first measured current from the second input pad ITP2, and calculate a first resistance value of the first loop based on the first test voltage and the first measured current. Here, the first resistance value of the first loop may include resistance values (or compression resistance values, bonding resistance values, contact resistance values) of the first and second input pads ITP1 and ITP2, resistance values of the first and second output pads OTP1 and OTP2, and a resistance value of the first detection line TL1. The first resistance value of the first loop may be calculated according to the following Equation 1.

$$R1 = R_{ITP1} + R_{ITP2} + R_{OTP1} + R_{OTP2} + R_{TL1} \qquad \text{[Equation 1]}$$

In Equation 1, R1 denotes the first resistance value of the first loop, $R_{ITP1}$ denotes the resistance value of the first input pad ITP1, $R_{ITP2}$ denotes the resistance value of the second input pad ITP2, $R_{OTP1}$ denotes the resistance value of the first output pad OTP1, $R_{OTP2}$ denotes the resistance value of the second output pad OTP2, and $R_{TL1}$ denotes the resistance value of the first detection line TL1.

Therefore, the inspection device may quickly determine whether or not the damage has occurred in regions included in the COF package 200 such as the first pad region AR1, the second pad region AR2 and the bending region BA, for example.

However, when whether the COF package 200 is damaged is determined using only the first detection line TL1, a location and a cause of the damage in the COF package 200 may not be detected. The damage in the COF package 200 may be caused by a defect of the first and second input pads ITP1 and ITP2, a poor compression of the second pad region AR2, a crack in the bending region BA, etc. In an exemplary embodiment of the invention, the COF package 200 further includes the second detection line TL2 in addition to the first detection line TL1. In such an embodiment, the cause and location of the damage in the COF package 200 may be analyzed using the second detection line TL2 more accurately.

In an exemplary embodiment, the second detection line TL2 may be disposed on the base substrate 220. The second detection line TL2 may connect the dummy pad DP to the first detection line TL1 (or the first sub-detection line STL1) via the third region AR3 to form a second loop between the dummy pad DP and the first input pad ITP1. The second detection line TL2 may cross the bending region BA.

In an exemplary embodiment, the dummy pad DP may include an alignment key AK. In one exemplary embodiment, for example, the dummy pad DP may be integrally formed to have the alignment key AK. In such an embodiment, the alignment key AK may be used for determining the alignment state of the input pads ITP1, ITP2 and the signal pads SP or used for determining the alignment state between the COF package 200 and the display panel 100 when the COF package 200 is connected to the display panel 100. In such an embodiment of the COF package 200, the dummy pad DP may be not connected to signal lines or detection lines and may not be used for transferring signals, as will be described later in detail with reference to FIG. 8. Therefore, in an exemplary embodiment of the COF package 200, the second detection line TL2 may be connected to the dummy pad DP (or the pad including the alignment key AK), thereby decreasing a scale of the first pad region AR1 and reducing the manufacturing cost thereof.

In an exemplary embodiment, the inspection device may apply a test signal to one (e.g., the first input pad ITP1) of the dummy pad DP and the first input pad ITP1, receive a second measured signal through the other (e.g., the dummy pad DP) of the dummy pad DP and the first input pads ITP1, and determine the location of the damage in the COF package 200 based on the test signal and the second measured signal. In one exemplary embodiment, for example, the inspection device may apply a second test voltage between the dummy pad DP and the first input pad ITP1, receive the second measured current from the dummy pad DP, and calculate a second resistance value of the second loop based on the second test voltage and the second measured current. Here, the second resistance value of the second loop may include resistance values (or compression resistance values, bonding resistance values, contact resistance values) of the dummy pad DP and the first input pad ITP1, and a resistance value of the second detection line TL2. The second resistance value of the second loop may be calculated according to the following Equation 2.

$$R2 = R_{DP} + R_{ITP1} + R_{TL2} \qquad \text{[Equation 2]}$$

In Equation 2, R2 denotes the second resistance value of the second loop, $R_{DP}$ denotes the resistance value of the dummy pad DP, $R_{ITP1}$ denotes the resistance value of the first input pad ITP1, and $R_{TL2}$ denotes the resistance value of the second detection line TL2.

The resistance value of the dummy pad DP may be substantially equal to the resistance value of the first input pad ITP1 because the dummy pad DP is similar to the first input pad ITP1 (for example, when both pads have substantially the same scale) and the dummy pad DP is adjacent to the first input pad ITP1 (for example, when both pads are bonded in the same way). Also, the resistance value of the second detection line TL2 may be substantially equal to the resistance value of the first detection line TL1. In this case, Equation 2 can be rewritten as Equation 3.

$$R2=2R_{ITP1}+R_{TL1} \quad \text{[Equation 3]}$$

Similarly, the second input pad ITP2 may be similar to the first input pad ITP1, and the second output pad OTP2 may be similar to the first output pad OTP1. Therefore Equation 1 can be rewritten as Equation 4.

$$R1=2R_{ITP1}+2R_{OTP1}+R_{TL1} \quad \text{[Equation 4]}$$

Therefore, the inspection device may calculate the resistance values of the output pads OTP1 and OTP2 and the detection lines TL1 and TL2 based on the resistance values of the first and second input pads ITP1 and ITP2, Equation 3 and Equation 4, and thereby determine the location of the damage based on a variation in the resistance values.

In an exemplary embodiment, as described above with reference to FIG. 3A, the COF package 200 includes the first detection line TL1 to allow the inspection device to quickly determine whether or not the COF package 200 is damaged. In such an embodiment, the COF package 200 includes the second detection line TL2 to allow the inspection device to accurately determine the location and cause of the damage in the COF package 200. In such an embodiment, the location and cause of the damage can be detected using the dummy pad DP (i.e., a pad including the alignment key and not being used generally). In such an embodiment, the COF package 200 may have a simple structure without an additional structure or element for detecting the damages.

Figure 3B:
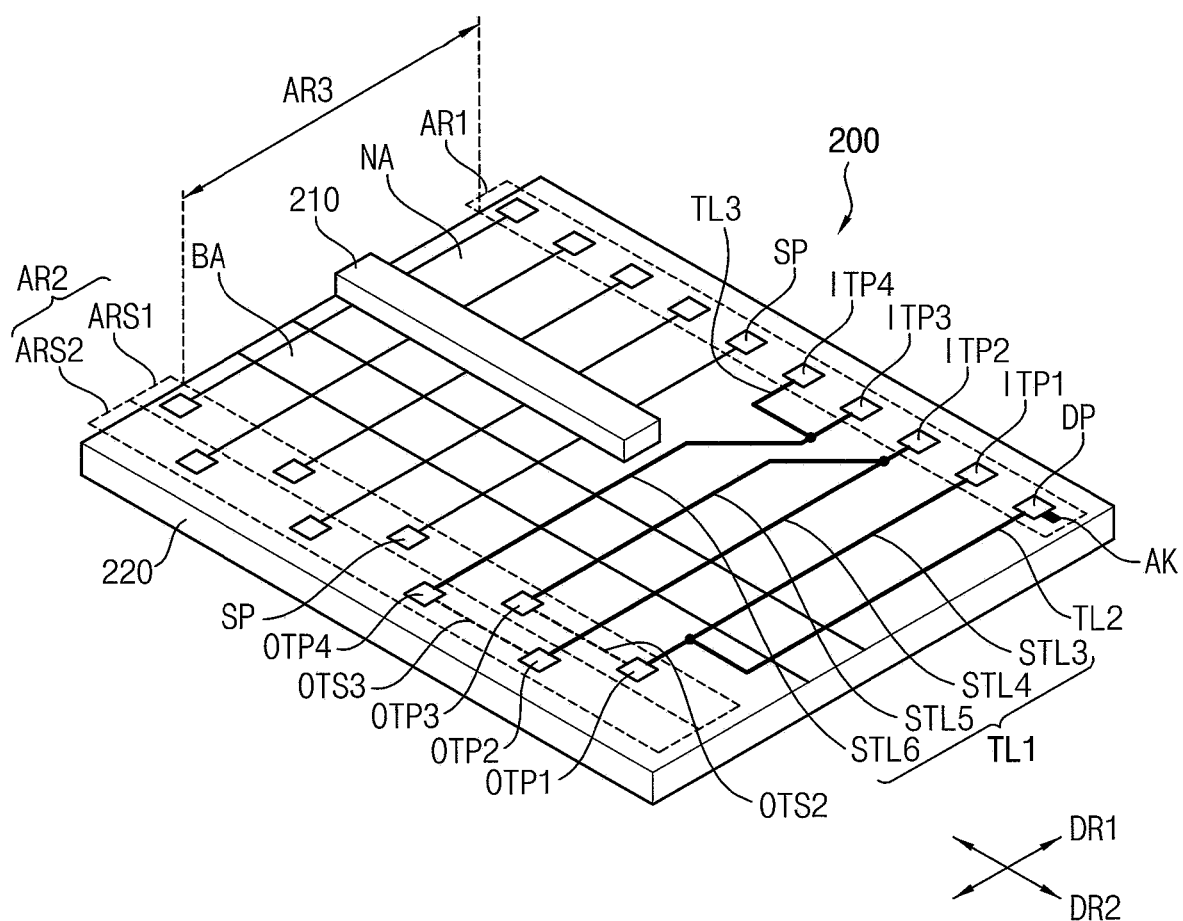
FIG. 3B is a diagram illustrating an alternative exemplary embodiment of a COF package included in a display device of FIG. 1.

FIG. 3B is a diagram illustrating an alternative exemplary embodiment of a COF package included in a display device of FIG. 1.

Referring to FIGS. 3A and 3B, the COF package 200 of FIG. 3B is substantially the same as or similar to the COF package 200 of FIG. 3A except for the arrangement of output pads OTP1 through OTP4 and the connection structure of the first detection line TL1. Therefore, any repetitive detailed description of the same or like elements will hereinafter be omitted or simplified.

In an exemplary embodiment, the second pad region AR2 may include a first sub-pad region ARS1 and a second sub-pad region ARS2. The first sub-pad region ARS1 may include first and third output pads OTP1 and OTP3. The second sub-pad region ARS2 may include second and fourth output pads OTP2 and OTP4. When the width of the PCB 300 (that is, the length of the PCB 300 in the second direction DR2) is relatively narrow, the spacing (or pitch) between the output pads OTP1 through OTP4 may be narrow. It may cause defects such as short circuit. Therefore, the COF package 200 can arrange the output pads OTP1 through OTP4 and the signal pads SP in two rows to prevent the defects.

In an exemplary embodiment, as show in FIG. 3B, the first sub-pad region ARS1 may include odd-numbered pads (or output pads), and the second sub-pad region ARS2 may include even-numbered pads (or output pads), but the arrangement of pads is not limited thereto. In one alternative exemplary embodiment, for example, the first sub-pad region ARS1 may include even-numbered pads. In such an embodiment, a pair of two adjacent pads may be alternately arranged in the first and second sub-pad regions ARS1 and ARS2.

In an exemplary embodiment, the first detection line TL1 may include third through sixth sub-detection lines STL3 to STL6. The third sub-detection line STL3 may connect the first input pad ITP1 to the first output pad OTP1. The fourth sub-detection line STL4 may connect the second input pad ITP2 to the second output pad OTP2. The fifth sub-detection line STL5 may connect the second input pad ITP2 to the third output pad OTP3. The sixth sub-detection line STL6 may connect the third input pad ITP3 to the fourth output pad OTP4. The first output pad OTL1 and the third output pad OTP3 may be interconnected to each other via a second short pad OTS2. The second output pad OTL2 and the fourth output pad OTP4 may be interconnected to each other via a third short pad OTS3. The second short pad OTS2 and the third short pad OTS3 may be included in the display panel 100, similarly to the first short pad OTS1 described above with reference to FIG. 3A. The second short pad OTS2 may be located in correspondence with a line for connecting the first output pad OTP1 and the third output pad OTP3 in the first substrate 10. The second short pad OTS2 may connect the first output pad OTP1 to the third output pad OTP3 at the shortest distance. Similarly, the third short pad OTS3 may be located in correspondence with a line for connecting the second output pad OTP2 and the fourth output pad OTP4 in the first substrate 10. The third short pad OTS3 may connect the second output pad OTP2 to the fourth output pad OTP4 at the shortest distance. The third through sixth sub-detection lines STL3 through STL6 may be spaced apart in the second direction DR2 and may generally extend in the first direction DR1.

In such an embodiment, a first sub-loop may be formed by the third sub-detection line STL3, the fifth sub-detection line STL5 and the second short pad OTS2. Thus, the first sub-loop may connect the first input pad ITP1 to the second input pad ITP2 and may be formed between the first input pad ITP1 and the second input pad ITP2 via the first sub-pad region ARS1. In such an embodiment, a second sub-loop may be formed by the fourth sub-detection line STL4, the sixth sub-detection line STL6 and the third short pad OTS3. Thus, the second sub-loop may connect the second input pad ITP2 to the third input pad ITP3 and may be formed between the second input pad ITP2 and the third input pad ITP3 via the second sub-pad region ARS2. In such an embodiment, the first loop may include the first and second sub-loops.

The second detection line TL2 may be disposed on the base substrate 220. The second detection line TL2 may connect the dummy pad DP to the first detection line TL1 (or the third sub-detection line STL3) via the third region AR3 to form a second loop between the dummy pad DP and the first input pad ITP1. The second detection line TL2 may pass through the bending region BA. The dummy pad DP may include an alignment key AK.

The COF package 200 may further include a third detection line TL3. The third detection line TL3 may form a third loop by connecting the third input pad ITP3 to the fourth input pad ITP4. The third detection line TL3 may connect the third input pad ITP3 to the fourth input pad ITP4 with a relatively short path.

In such an embodiment, as described with reference to FIG. 3A, an inspection process for determining whether or not the COF package 200 is damaged may be performed using an inspection device in the manufacturing process of the display device 1000.

The inspection device may apply a first test voltage between the first input pad ITP1 and the third input pad ITP3, receive the first measured current from the third input pad ITP3, and calculate a first resistance value of the first loop based on the first test voltage and the first measured current. Here, the first loop indicates a path from the first input pad ITP1 to the third input pad ITP3 in FIG. 3B. The first resistance value of the first loop may include the resistance values (or compression resistance values, bonding resistance values, contact resistance values) of the first and third input pads ITP1 and ITP3, the resistance values of the first through fourth output pads OTP1 through OTP4, and the resistance value of the first detection line TL1. The first resistance value of the first loop may be calculated according to Equation 5.

$$R1=2R_{ITP1}+4R_{OPT1}+R_{TL1} \quad \text{[Equation 5]}$$

In Equation 5, R1 denotes the first resistance value of the first loop, $R_{ITP1}$ denotes the resistance value of the first input pad ITP1, $R_{OTP1}$ denotes the resistance value of the first output pad OTP1, and $R_{TL1}$ denotes the resistance value of the first detection line TL1. Here, it is assumed that the resistance value of the third input pad ITP3 is equal to the resistance value of the first input pad ITP1, each of the resistance values of the second through fourth output pad OTP2, OTP3, OTP4 is equal to the resistance value of the first output pad OTP1.

When the first resistance value of the first loop is out of the error range of the reference resistance value (e.g., when the first resistance value is larger than the reference resistance value), the inspection device may determine that the COF package 200 is damaged.

The inspection device may determine whether or not the damage occurs in the first pad region AR1 by applying a fourth test voltage between the third input pad ITP3 and the fourth input pad ITP4. In addition, the inspection device may determine whether or not damage occurs in the bending region BA or the like based on Equation 3 by applying the second test voltage to the dummy pad DP and the first input pad ITP1. Further, the inspection device may determine whether or not damage occurs in the second pad region AR2 based on Equation 3 and Equation 5. Similarly, the inspection device may determine whether or not damage occurs in the first sub-pad region ARS1 and the second sub-pad region ARS2 of the second pad region AR2, respectively.

As described above with reference to FIG. 3B, an exemplary embodiment of the COF package 200 may include pads arranged in two rows and the first detection line TL1 in a way such that the inspection device quickly determines whether or not the COF package 200 is damaged. In such an embodiment, the COF package 200 may include the second detection line TL2 in a way such that the inspection device accurately determines the location and cause of the damage in the COF package 200.

In an exemplary embodiment, as shown in FIG. 3B, the second pad region AR2 includes pads arranged in two rows and the first pad region AR1 includes pads arranged in one rows, but not being limited thereto. In one alternative exemplary embodiment, for example, when the width of the display panel 100 is relatively narrow (e.g., the display panel for the head mounted display device), a first pad region AR1 of the COF package 200 may include pads arranged in two rows.

FIGS. 4A through 4F are diagrams illustrating an exemplary embodiment of a COF package of FIG. 3B.

In FIGS. 4A through 4F, a sectional view in which the COF package 200 is cut along sectional line I-I' and a plan view of the COF package 200 are shown are shown on the basis of the state of the COF package 200 of FIG. 1 (thus, the state in which the COF package 200 is connected to the display panel 100 without bending).

In an exemplary embodiment, the base substrate 220 may include one or more layers. Each of the first detection line TL1 and the second detection line TL2 may be disposed or formed the one or more layers.

The base substrate 220 may include a first insulating layer L2. A first conductive layer L1 may be disposed on a surface (e.g., a lower surface) of the first insulating layer L2. A second conductive layer L3 may be disposed on an opposing surface (e.g., an upper surface) of the first insulating layer L2. Each of the first detection line TL1 and the second detection line TL2 may be defined or formed by the first conductive layer L1 or the second conductive layer L3. The first conductive layer L1 and the second conductive layer L3 may have a high electrical conductivity by including a metal such as copper (Cu), nickel (Ni) and gold (Au), for example.

In an exemplary embodiment, as described above with reference to FIG. 4A, the base substrate 220 may include one layer (i.e., the first insulating layer L2), but the invention is not limited thereto. In one exemplary embodiment, for example, the base substrate 220 may a flexible substrate including a plurality of insulating layers. In such an embodiment, each of the first detection line TL1 and the second detection line TL2 may be defined or formed via the plurality of insulating layers. In one exemplary embodiment, for example, each of the first detection line TL1 and the second detection line TL2 may be separately disposed on the upper surface and the lower surface of one of the plurality of insulating layers, and disposed between the plurality of insulating layers.

Figure 4A:
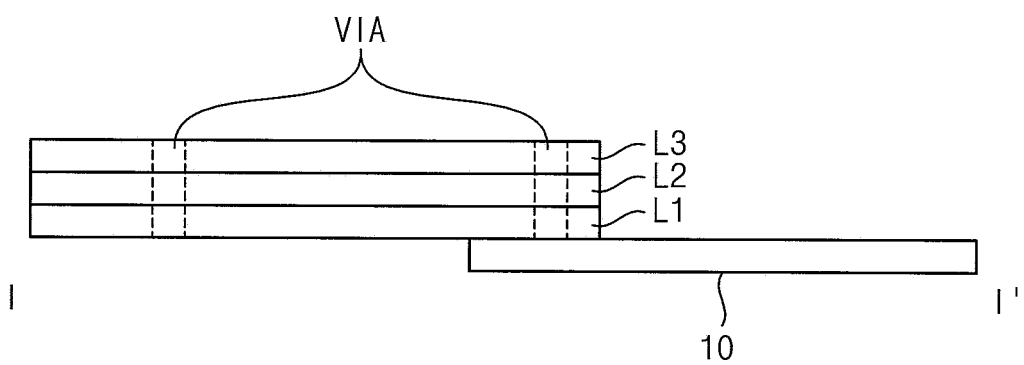
FIGS. 4A through 4F are diagrams illustrating an exemplary embodiment of a COF package of FIG. 3B.

The dotted line shown in FIG. 4A indicates a via structure VIA for electrically connecting a specific point of the first conductive layer L1 to a specific point of the second conductive layer L3 through the first insulating layer L2.

Figure 4B:
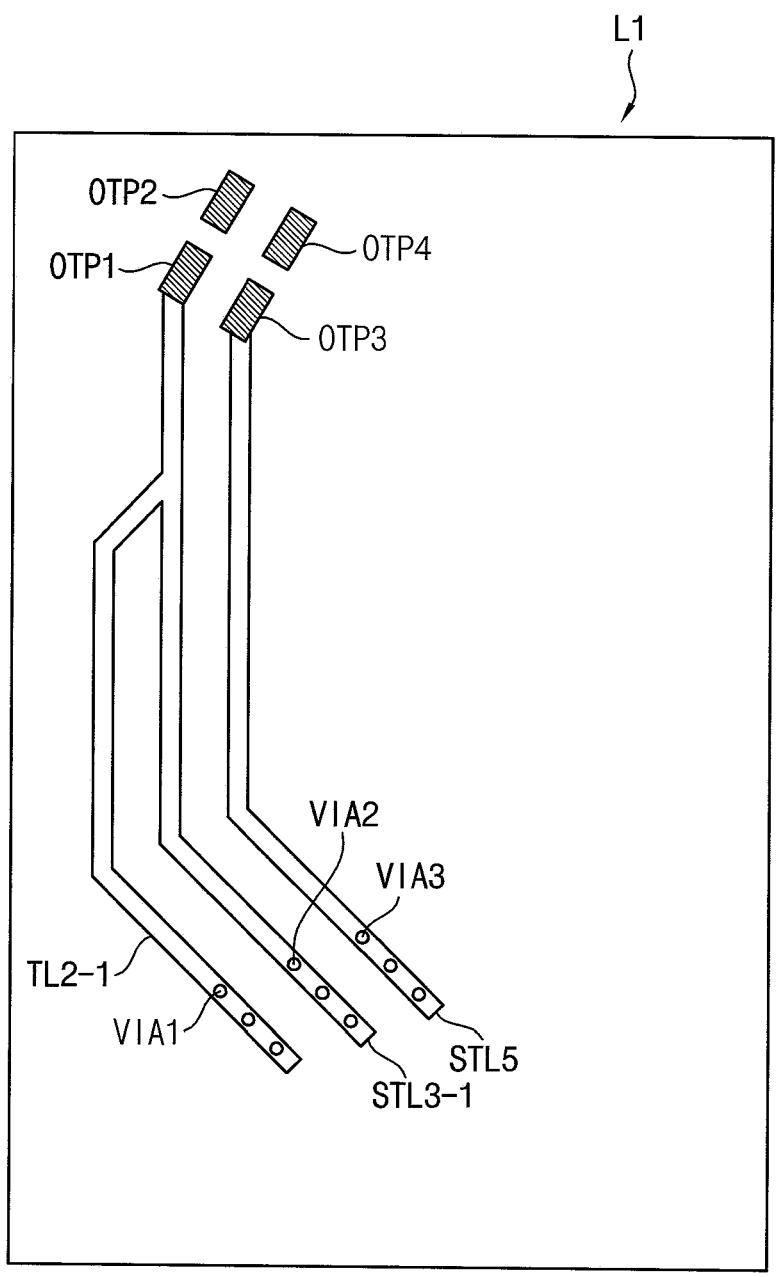

In an exemplary embodiment, as shown in FIG. 4B, the first conductive layer L1 may include the first through fourth output pads OTP1 through OTP4, a first partial detection line TL2-1 of the second detection line TL2, the first sub-partial detection line STL3-1 of the third sub-detection line STL3, and the fifth sub-detection line STL5. The first sub-partial detection line STL3-1 may be connected to the first output pad OTP1 and the second via structure VIA2. The fifth sub-detection line STL5 may be connected to the third output pad OTP3 and the third via structure VIA3. The first partial detection line TL2-1 may be connected to the first sub-partial detection line STL3-1 and the first via structure VIA1.

Figure 4C:
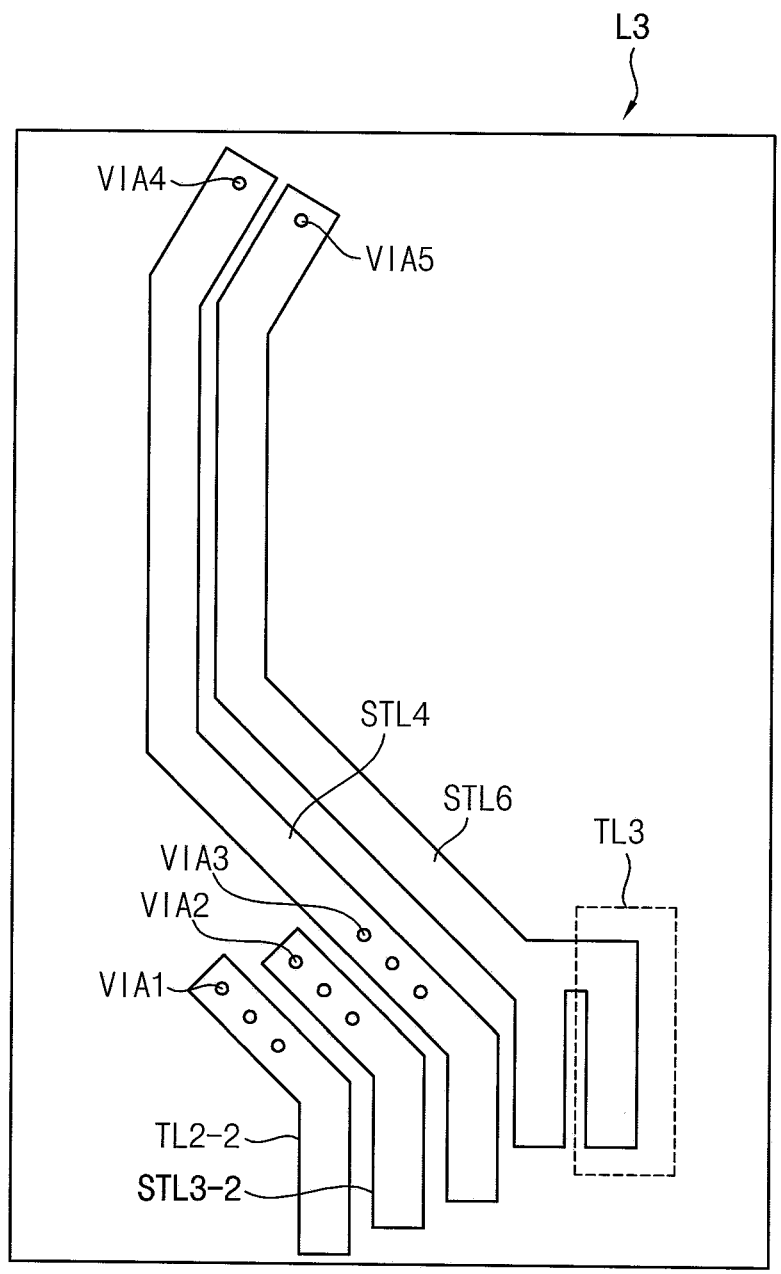

In such an embodiment, as shown in FIG. 4C, the second conductive layer L3 may include the second partial detection line TL2-2 of the second detection line TL2, the second sub-partial detection line STL3-2 of the third sub-detection line STL3, the fourth sub-detection line STL4, the sixth sub-detection line STL6, and the third detection line TL3. The second partial detection line TL2-2 may be connected to the first via structure VIA1. The second sub-partial detection line STL3-2 may be connected to the second via structure VIA2. The fourth sub-detection line STL4 may be connected to the third via structure VIA3 and a fourth via structure VIA4. The sixth sub-detection line STL6 may be connected to a fifth via structure VIA5 and the third detection line TL3.

Figure 4D:
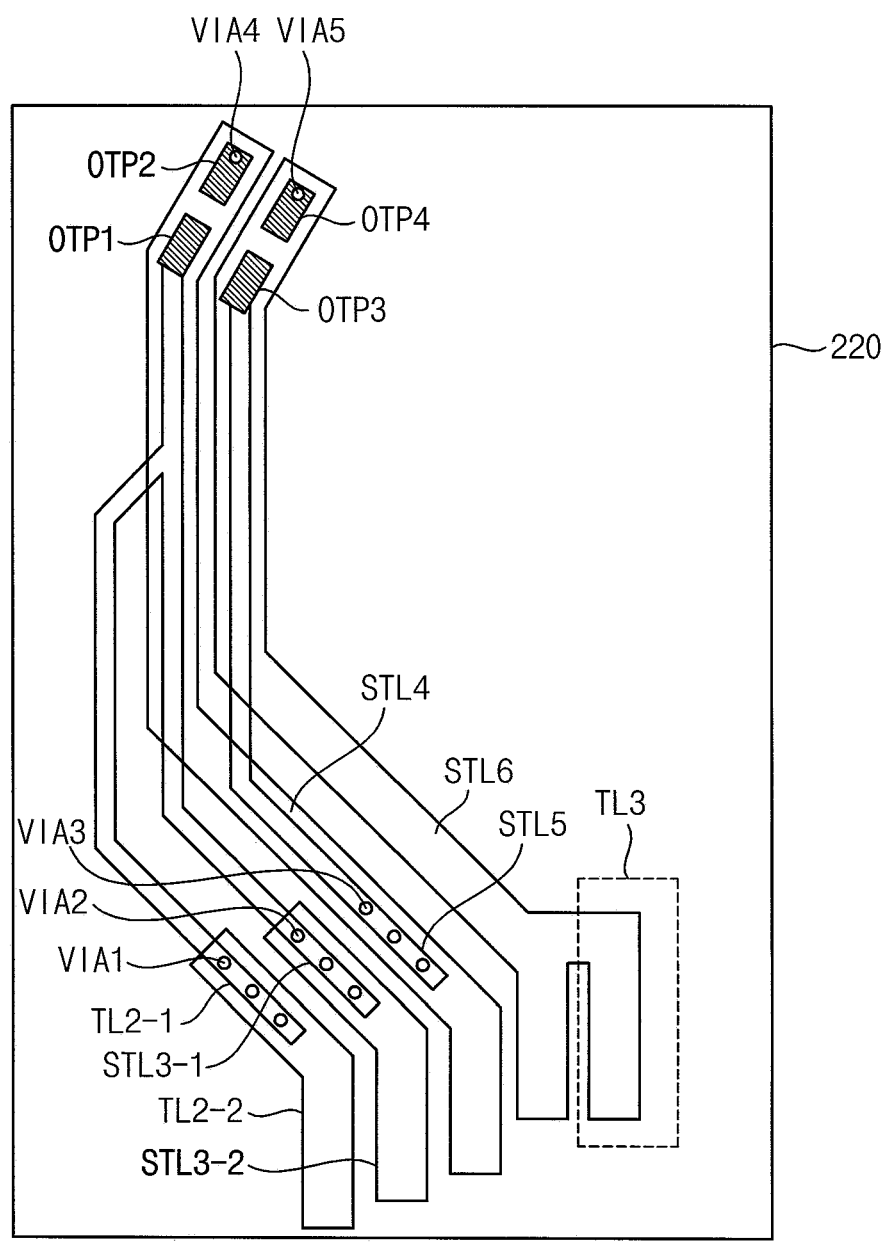

FIG. 4D illustrates the first conductive layer L1, the first insulating layer L2, and the second conductive layer L3 that are sequentially stacked one on another.

The second detection line TL2 may include the first partial detection line TL2-1 of the first conductive layer L1 and the second partial detection line TL2-2 of the second conductive layer L3. The first partial detection line TL2-1 and the second partial detection line TL2-2 may be connected to each other via the first via structure VIA1. Thus, the second detection line TL2 may be formed by the first conductive layer L1 and the second conductive layer L3 (i.e., formed via the first conductive layer L1 and the second conductive layer L3).

In such an embodiment, the third sub-detection line STL3 may include the first sub-partial detection line STL3-1 of the first conductive layer L1 and the second sub-partial detection line STL3-2 of the second conductive layer L3. The first sub-partial detection line STL3-1 may be connected to the second sub-partial detection line STL3-2 via the second via structure VIA2. Thus, the third sub-partial detection line STL3 may be formed by the first conductive layer L1 and the second conductive layer L3.

The fourth sub-detection line STL4 may be connected to the second output pad OTP2 of the first conductive layer L1 via the fourth via structure VIA4 and may be connected to the fifth sub-detection line STL5 of the first conductive layer L1 via the third via structure VIA3.

Similarly, the sixth sub-detection line STL6 may be connected to the fourth output pad OTP4 of the first conductive layer L1 via the fifth via structure VIA5.

Figure 4E:
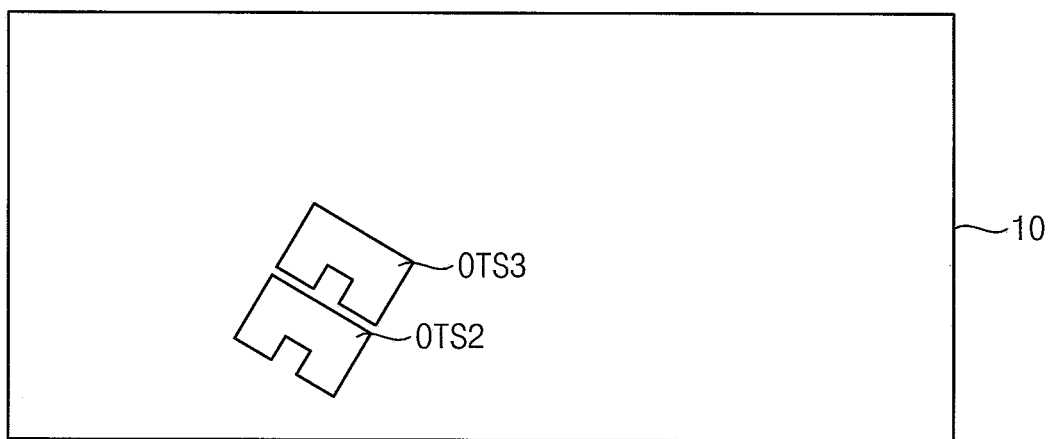

In such an embodiment, as shown in FIG. 4E, the first substrate 10 of the display panel 100 may include the second short pad OTS2 and the third short pad OTS3 located at positions corresponding to the first through fourth output pads OTP1 through OTP4.

Figure 4F:
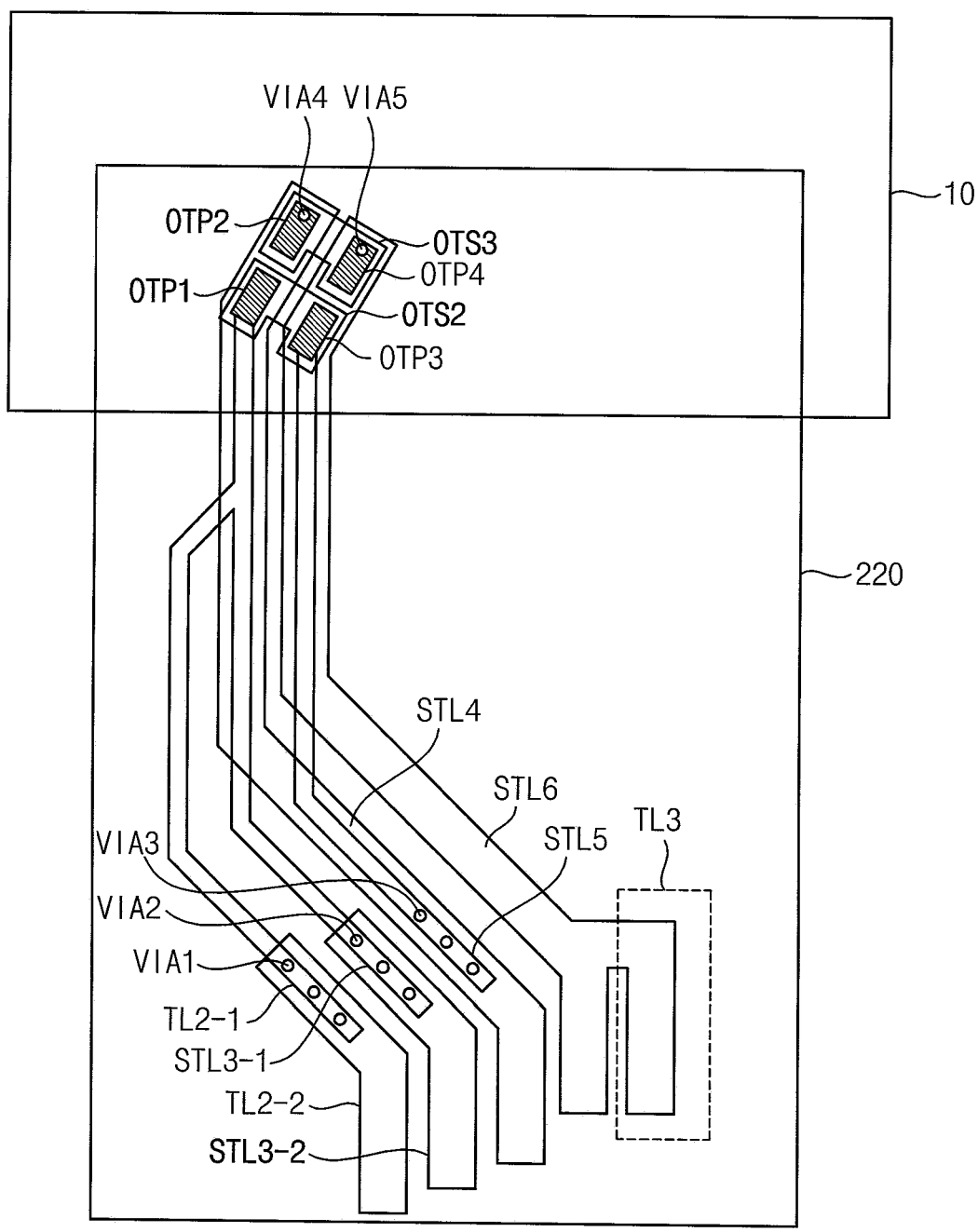

In an exemplary embodiment, as shown in FIGS. 4A and 4F, when the first substrate 10 of the display panel 100 is bonded to the base substrate 220 (or the COF package 200), the second short pad OTS2 may connect the first output pad OTP1 to the third output pad OTP3, and the third short pad OTS3 may connect to the second output pad OTP2 to the fourth output pad OTP4.

Therefore, as described above with reference to FIG. 3B, the first sub-loop may be formed by the third sub-detection line STL3, the fifth sub-detection line STL5, and the second short pad OTS2. The second sub-loop may be formed with the fourth sub-detection line STL4, the sixth sub-detection line STL6, and the third short pad OTS3. Also, the second loop may be formed with the second detection line TL2 and the third sub-detection line STL3.

In such an embodiment, as described above, each of the first detection line TL1 and the second detection line TL2 may be formed via the plurality of layers (i.e., the first conductive layer L1 and the second conductive layer L3).

In an exemplary embodiment, where the COF package 200 includes the pads arranged in two rows as shown in FIG. 3B, detection lines (or signal lines) may be formed via the plurality of layers to prevent interference between pads and the detection lines (or the signal lines). In an exemplary embodiment, in an exemplary embodiment, the detection lines included in the COF package 200 may be formed via a plurality of layers, not being limited to a structure having a single layer.

In exemplary embodiments, as described above with reference to FIGS. 4A through 4F, the base substrate 220 is formed with one insulating layer (i.e., the first insulating layer L2), and the second detection line TL2 and the third detection line TL3 are formed with two layers (i.e., the first conductive layer L1 and the second conductive layer L3) that are connected to each other via the via structures, but not being limited thereto. In one exemplary embodiment, for example, the base substrate 220 may include a plurality of insulating layers, and each of the third through sixth sub-detection lines STL3 through STL6 may be formed with conductive layers disposed on or between the plurality of insulating layers.

Figure 5:
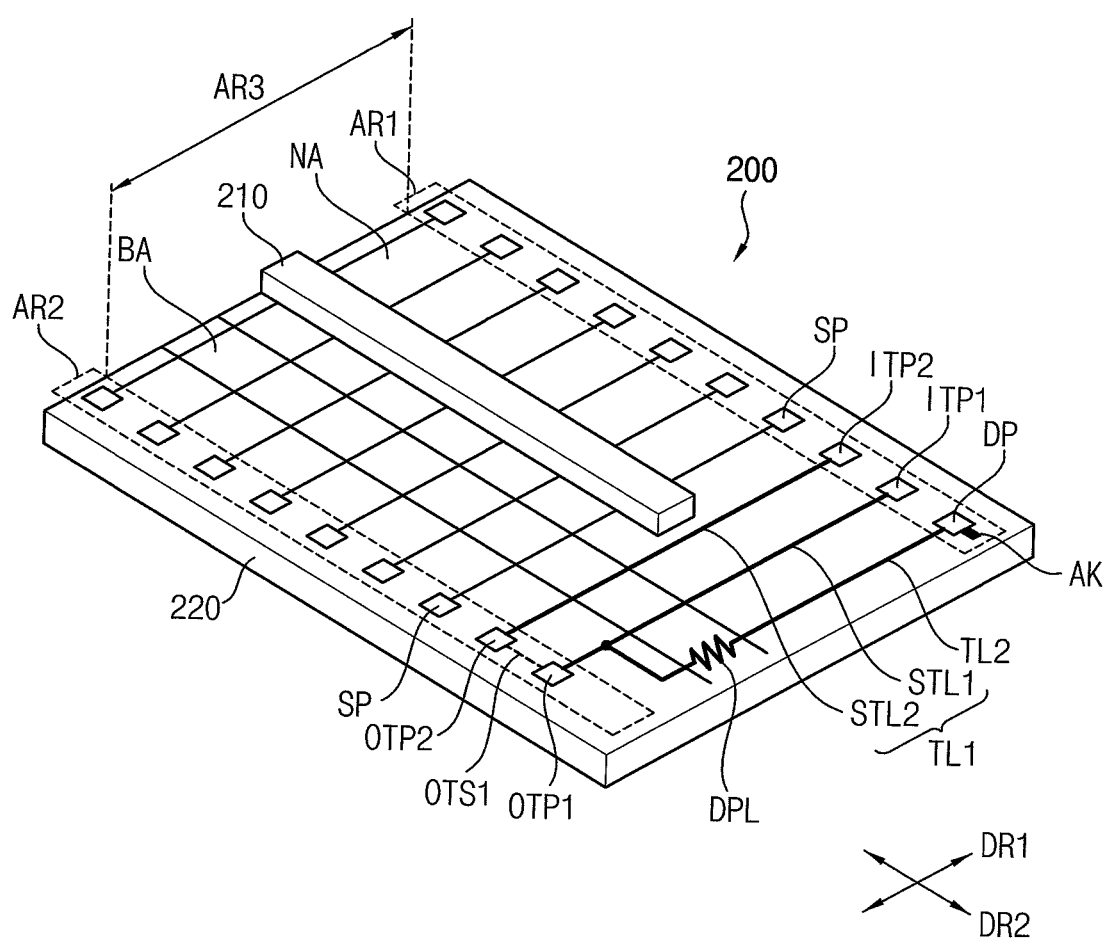
FIG. 5 is a diagram illustrating an exemplary embodiment of a COF package of FIG. 3A.
Figure 6A:
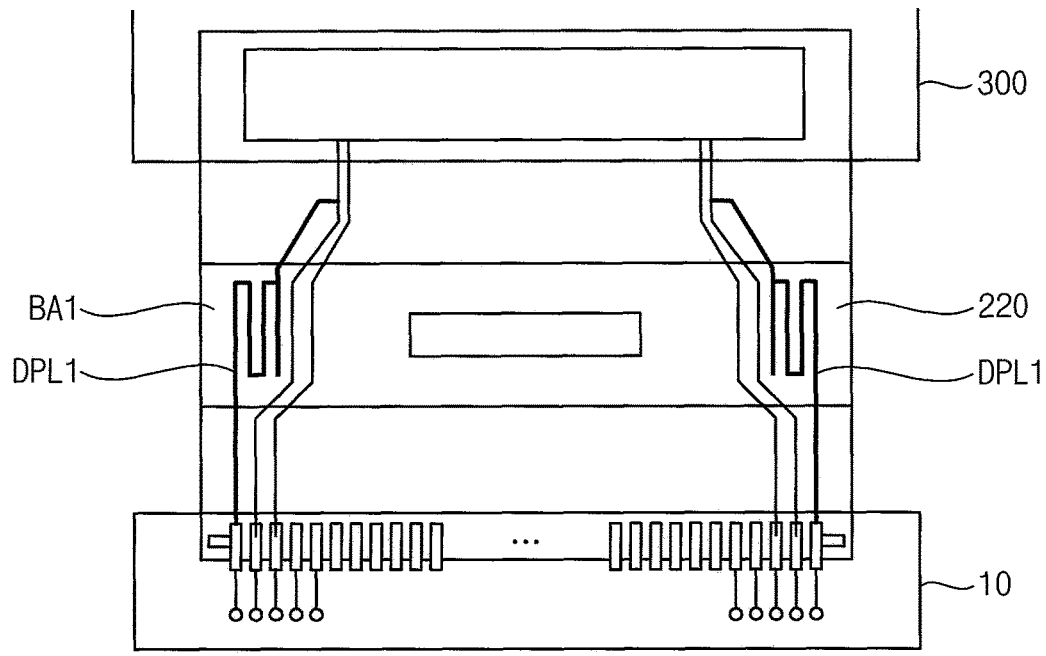
FIGS. 6A through 6C are diagrams illustrating exemplary embodiments of a COF package of FIG. 5.
Figure 6B:
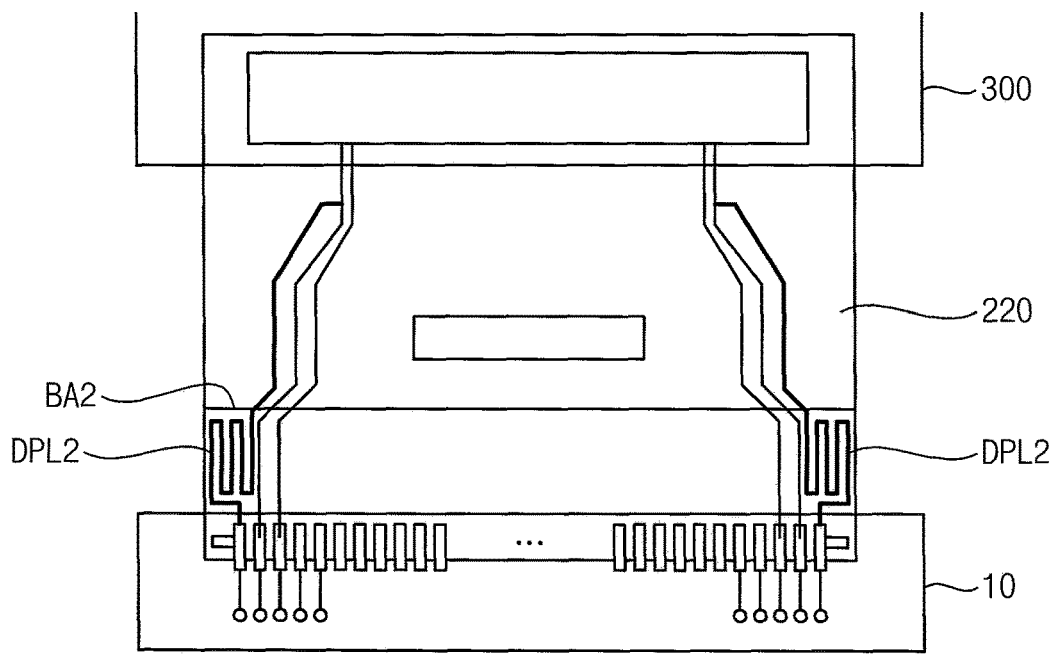
Figure 6C:
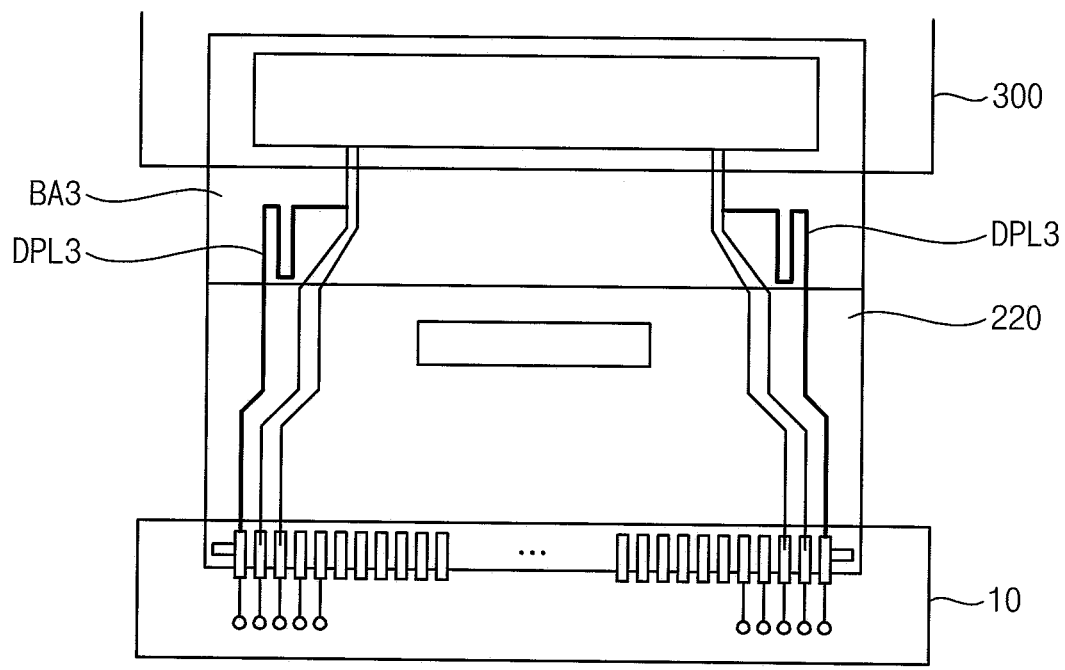

FIG. 5 is a diagram illustrating an exemplary embodiment of a COF package of FIG. 3A. FIGS. 6A through 6C are diagrams illustrating exemplary embodiments of a COF package of FIG. 5.

Referring to FIGS. 3A and 5, the COF package 200 of FIG. 5 may be substantially the same as the COF package 200 of FIG. 3A except for a detection pattern DPL. Therefore, any repetitive detailed description of the same or like elements will hereinafter be omitted or simplified.

In an exemplary embodiment, the second detection line TL2 may include the detection pattern DPL extending in a first direction DR1 in a portion of the third region AR3 to have a relatively longer length in comparison with the straight line. In one exemplary embodiment, for example, the detection pattern DPL may be disposed in a zigzag pattern (e.g., a staggered pattern or a meander line pattern). Here, the zigzag pattern represents a variety of patterns for the relatively longer length. For example, the zigzag pattern may be a pattern made up of corners at one or more angles.

In an exemplary embodiment, the detection pattern DPL may be located in the bending region BA.

In such an embodiment, as described above, because the bending region BA is relatively easily damaged, the COF package 200 (or the second detection line TL2) may include the detection pattern DPL to improve a detection capability for the damage in the bending region BA and to improve a detection capability of external inspection device.

In an exemplary embodiment, the COF package 200 may determine the location of the detection pattern DPL in correspondence with the bending region BA.

Referring to FIG. 6A, in an exemplary embodiment, the bending region or a first bending region BA1 may be located in a central region in which the IC chip 210 is disposed (i.e., a region including the center of the region of the COF package 200). In such an embodiment, the first detection pattern DPL1 may be formed in the first bending region BA1. The first detection pattern DPL1 may have a zigzag pattern changing in a direction (e.g., a vertical direction) different from a direction (e.g., a horizontal direction) in which the detection pattern of FIG. 5 changes. The first detection pattern DPL1 may have a relatively long length and a relatively large area in comparison with the straight line in the first bending region BA1. Accordingly, the COF package 200 may improve a damage detection capability for relatively large portion of the first bending region BA1, and may improve a sensitivity of the damage detection for the first bending region BA1.

Referring to FIG. 6B, in an alternative exemplary embodiment, the bending region or a second bending region BA2 may be located adjacent to the display panel 10 (or the first pad region AR1). In such an embodiment, the second detection pattern DPL2 may be formed on the second bending region BA2. Thus, the COF package 200 may improve the damage detection capability for relatively large portion of the second bending region BA2 and a sensitivity of the damage detection for the second bending region BA2.

Referring to FIG. 6C, in another exemplary embodiment, the bending region or a third bending region BA3 may be located adjacent to the PCB 300 (or the second pad region AR2). In such an embodiment, the third detection pattern DPL3 may be formed on the third bending region BA3. The COF package 200 may improve the damage detection capability for the third bending region BA3.

In such embodiments, as described above, the COF package 200 (or the second detection line TL2) may include the detection pattern DPL formed in the bending region BA, thereby improving a damage detection capability for the bending region BA. In such embodiments, as shown in FIGS. 6A through 6C, a detection pattern, e.g., the first through third detection patterns DPL1 through DPL3, may be located in correspondence with a bending region, e.g., the first through third bending regions BA1 through BA3, but locations of the detection patterns are not limited thereto. In one exemplary embodiment, for example, when there is a region in which damage is frequently occurred, the COF package 200 may include the detection pattern DPL in the region in which the damage is frequently occurred regardless of the bending region BA.

Figure 7A:
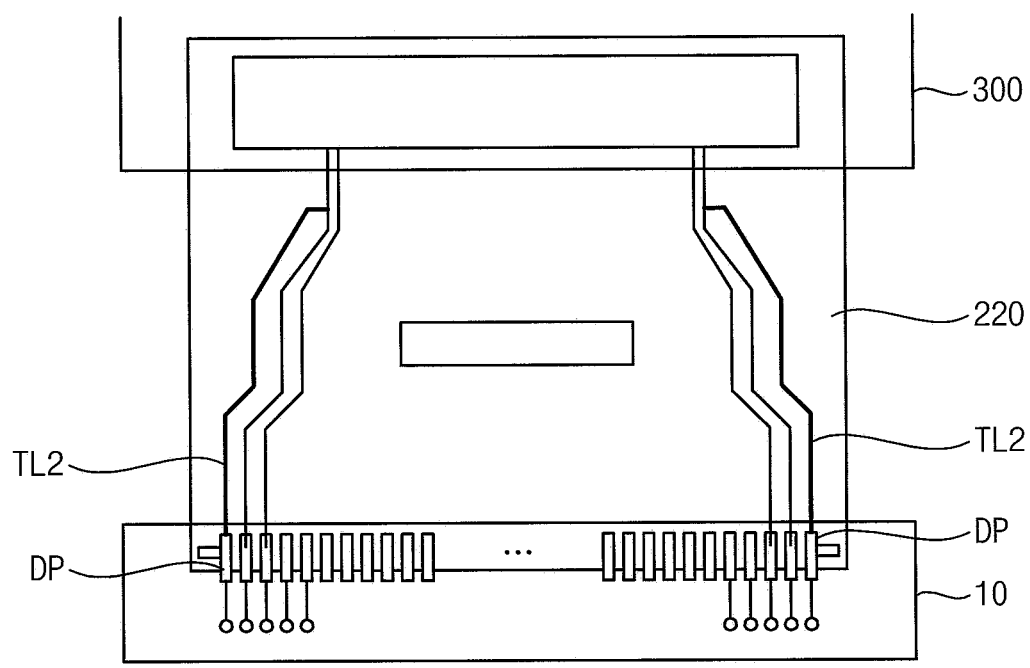
FIGS. 7A through 7C are diagrams illustrating exemplary embodiments of a COF package included in the display device of FIG. 1.
Figure 7B:
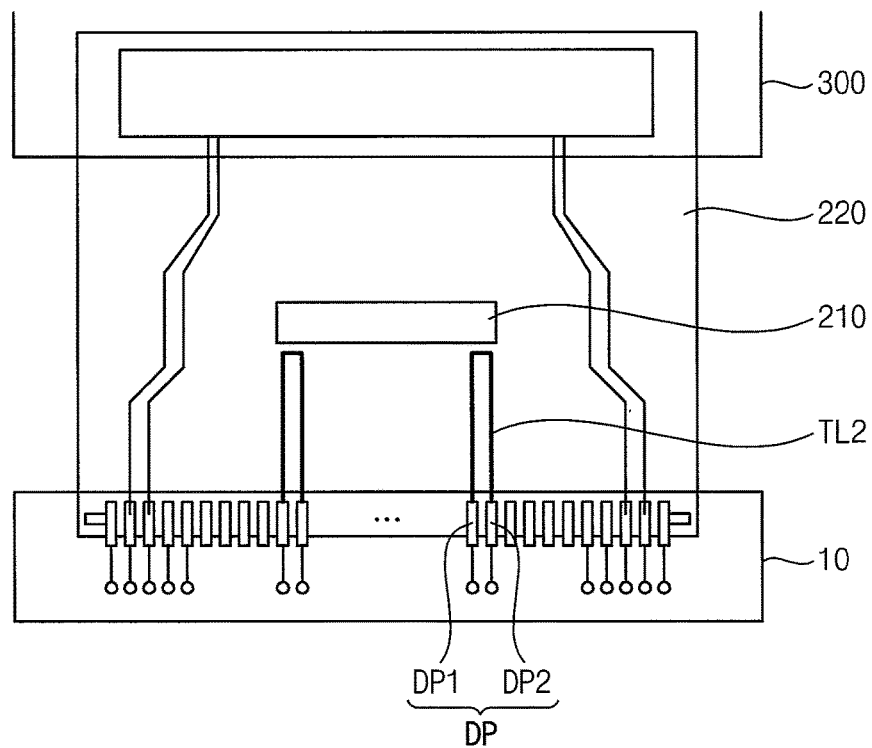
Figure 7C:
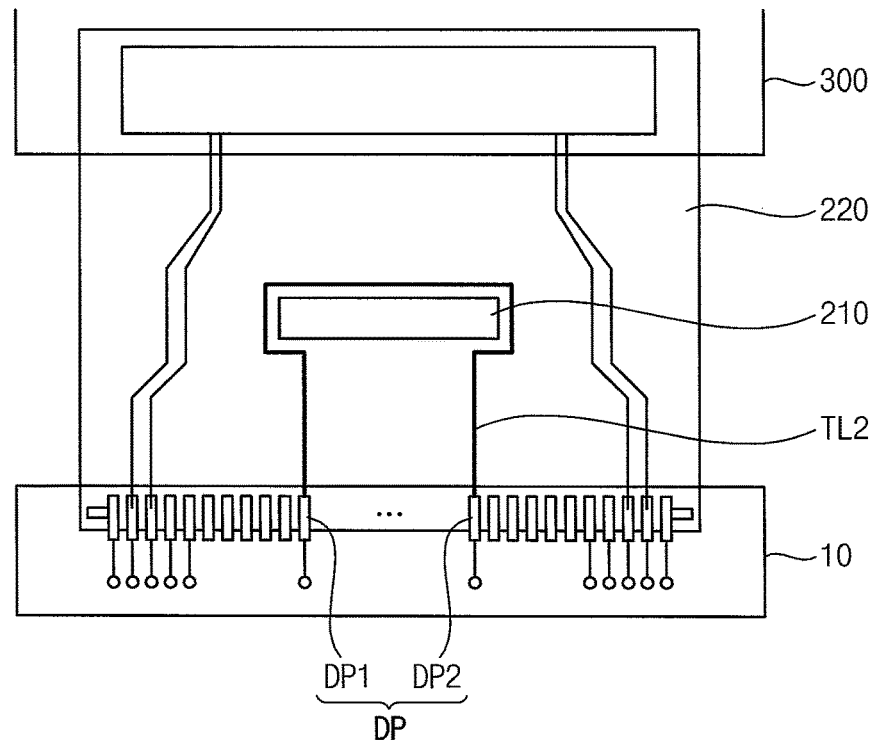

FIGS. 7A through 7C are diagrams illustrating exemplary embodiments of a COF package included in the display device of FIG. 1.

Referring to FIG. 7A, in an exemplary embodiment, the dummy pad DP may be located at an edge portion of the first pad region AR1. Thus, the dummy pad DP may be outermost one among the pads disposed on the first pad region AR1. In such an embodiment, the second detection line TL2 may be arranged along the edge (or adjacent to the edge) of the COF package 200. Accordingly, a damage occurring in a direction from the edge of the COF package 200 to the center of the COF package 200 may be efficiently detected.

Referring to FIG. 7B, in an alternative exemplary embodiment, the dummy pad DP may be located adjacent to a center of the first pad region AR1 (e.g., the center point in a horizontal direction of the first pad region AR1). Thus, the dummy pad DP may be a pad that is relatively adjacent to the center point among the pads formed in the first pad region AR1. In such an embodiment, the second detection line TL2 may be arranged inside the COF package 200. The damage in the second bending region BA2 shown in FIG. 6B and occurring in a direction from the center of the COF package 200 to the edge of the COF package 200 may be efficiently detected.

In such an embodiment, because the dummy pad DP is formed independently of the first detection line TL1, the dummy pad DP may be defined by a pair of dummy pads DP1 and DP2 that are connected to each other by the second detection line TL2 to be used for damage detection.

Referring to FIG. 7C, in an alternative exemplary embodiment, the dummy pad DP may be located adjacent to the center of the first pad region AR1 as in FIG. 7B. In such an embodiment, the second detection line TL2 of FIG. 7C may be arranged partially surround the IC chip 210. In such an embodiment, a damage in the first bending region BA1 of FIG. 6A and occurring in a direction from the center of the COF package 200 to the edge of the COF package 200 may be efficiently detected.

In exemplary embodiment, as described above with reference to FIGS. 7A through 7C, the location of the dummy pad DP and the arrangement (or the location) of the second detection line TL2 may be determined based on the location of the bending region BA and the damage occurrence characteristics (e.g., how to the damage progresses, where the damage occurs, etc.).

Figure 8A:
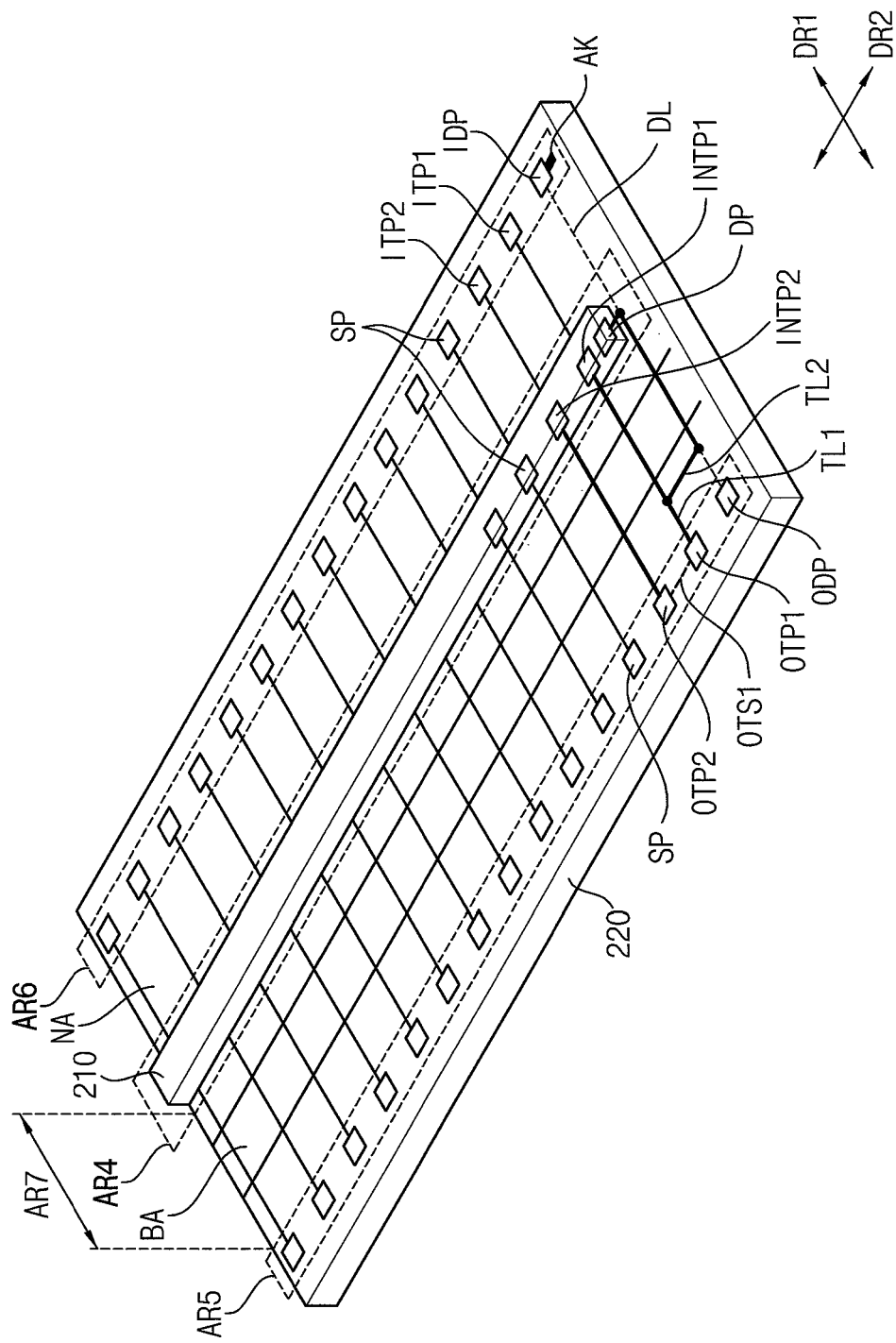
FIG. 8A is a diagram illustrating another alternative exemplary embodiment of a COF package included in a display device of FIG. 1.

FIG. 8A is a diagram illustrating another alternative exemplary embodiment of a COF package included in a display device of FIG. 1.

Referring to FIGS. 1 and 8A, an exemplary embodiment of the COF package 200 may include a base substrate 220, a plurality of pads (or a plurality of pad electrodes), an IC chip 210, a first detection line TL1, and a second detection line TL2.

In such an embodiment, the COF package 200 may include a bending region BA and a non-bending region NA. The non-bending region NA may include a fourth pad region AR4 (or an inner lead bonding region), a fifth pad region AR5 (or an output outer lead bonding region), and a sixth pad region AR6 (or an input outer lead bonding region). A seventh region AR7 may be located between the fourth pad region AR4 and the fifth pad region AR5. The bending region BA may be located in the seventh region AR7. Similarly to an exemplary embodiment of the COF package 200 shown in FIG. 3A, the fifth pad region AR5 may be a region for being bonded to the display panel 100. In such an embodiment, the fourth pad region AR4 may be a region for being bonded to the IC chip 210, and the sixth pad region AR6 may be a region for being bonded to the PCB 300. The fourth pad region AR4 may be located at the center of the COF package 200 in the first direction DR1. The fifth pad region AR5 may be located at one end (or adjacent to one end) of the COF package 200 in the first direction DR1, and the sixth pad region AR6 may be located at the other end (or adjacent to the other end) of the COF package 200 in the first direction DR1.

The fourth pad region AR4 may include a dummy pad DP, inner pads INTP1, INTP2, and signal pads SP. The fifth pad region AR5 may include output pads OTP1, OTP2 and signal pads SP. The sixth pad region AR6 may include input pads ITP1, ITP2 and signal pads SP.

The first detection line TL1 may be disposed on the base substrate 220 and may be connected to the first inner pad INTP1 and the second inner pad INTP2. The first detection line TL1 may form a first loop between the first inner pad INTP1 and the second inner pad INTP2 via the fifth pad region AR5.

The second detection line TL2 may be disposed on the base substrate 220. The second detection line TL2 may connect the dummy pad DP to the first detection line TL1 to form a second loop between the dummy pad DP and the first inner pad INTP1.

The connection structure of the dummy pad DP and the first/second detection lines TL1, TL2 of FIG. 8A may be substantially the same as or similar to the connection structure of the dummy pad DP and the first/second detection lines TL1, TL2 of FIG. 3A. Therefore, any repetitive detailed description of the same or like elements will hereinafter be omitted or simplified.

In such an embodiment, similarly to the external inspection device described above with reference to FIG. 3A, the IC chip 210 may apply a first test signal to one (e.g., the first inner pad INTP1) of the first inner pad INTP1 and the second inner pad INTP2, receive a first measured signal from the other one (e.g., the second inner pad INTP2) of the first inner pad INTP1 and the second inner pad INTP2, and determine whether or not the COF package 200 is damaged based on the first test signal and the first measured signal. In one exemplary embodiment, for example, the IC chip 210 may apply a first test voltage between the first inner pad INTP1 and the second inner pad INTP2, receive a first measured current from the second inner pad INTP2, and calculate a first resistance value of the first loop based on the first test voltage and the first measured current. Here, the first resistance value of the first loop may include resistance values (e.g., compression resistance values, bonding resistance values or contact resistance values) of the first and second inner pads INTP1 and INTP2, resistance values of the first and second output pads OTP1 and OTP2, and a resistance value of the first detection line TL1. The first resistance value of the first loop may be calculated according to Equation 1 described above.

In such an embodiment, the IC chip 210 may apply a second test signal to one (e.g., the first inner pad INTP1) of the dummy pad DP and the first inner pad INTP1, receive a second measured signal through the other one (e.g., the dummy pad DP) of the dummy pad DP and the first inner pad INTP1, and determine the location and cause of the damage in the COF package 200 based on the second test signal and the second measured signal. In one exemplary embodiment, for example, the IC chip 210 may apply a second test voltage between the dummy pad DP and the first inner pad INTP1, receive the second measured current from the dummy pad DP, and calculate a second resistance value of the second loop based on the second test voltage and the second measured current. Here, the second resistance value of the second loop may include resistance values (e.g., compression resistance values, bonding resistance values or contact resistance values) of the dummy pad DP and the first inner pad INTP1, and a resistance value of the second detection line TL2. The second resistance value of the second loop may be calculated according to Equation 2 described above.

Therefore, the IC chip 210 may respectively calculate the resistance values of the output pads OTP1, OTP2 and the detection lines TL1 and TL2 based on Equations 1 and 2 (or Equations 3 and 4), and may determine the location of the damage based on a variation in the resistance values.

In an exemplary embodiment, the IC chip 210 may continuously detect (or monitor) whether or not the COF package 200 is damaged while the display device 1000 is normally driven. In such an embodiment, the IC chip 210 may transmit a monitoring result to an external device (e.g., an application processor (AP)), and the external device may control the display device 1000 based on the monitoring result. In one exemplary embodiment, for example, when the COF package 200 is damaged, the application processor may stop the display panel 100 based on the monitoring result not to display an image.

In an exemplary embodiment, the dummy pad DP may be connected to the second inner pad INTP2 with a relatively short path. The IC chip 210 may apply a third test voltage between the dummy pad DP and the second inner pad INTP2, receive a third measured current from the dummy pad DP, and calculate resistance values of inner pads INTP1, INTP2 based on the third test voltage and the third measured current.

In an exemplary embodiment, the COF package 200 may further include a dummy line DL. The dummy line DL may extend from the fifth pad region AR5 (or one end of the base substrate 220) to the sixth pad region AR6 (or the other end of the base substrate 220) in the first direction DR1. In such an embodiment, the second detection line TL2 may be defined by at least a portion of the dummy line DL.

In one exemplary embodiment, for example, the COF package 200 may further include an output dummy pad ODP disposed on the fifth pad region AR5 and an input dummy pad IDP disposed on the sixth pad region AR6. In such an embodiment, the dummy line DL may connect the output dummy pad ODP to the input dummy pad IDP. The first and second detection lines TL1, TL2 of FIG. 8 may not cover entire region of the COF package 200 and may cover only a portion (e.g., a half region) of the COF package 200 on the basis of the first direction DR1. Therefore, the dummy line DL may be formed in the manufacturing process of the COF package 200 to provide the second detection line TL2, and then the dummy line DL may not be used after the COF package 200 is connected to the display panel 100 and the PCB 300.

The COF package 200 may form the second detection line TL2 (or the second loop) using the dummy pad DP (i.e., a pad including the alignment key and not being used generally) and the dummy line DL (i.e., a line for detecting a crack in the manufacturing process of the COF package 200 and not being used for the display device 1000). Therefore, the COF package 200 may determine whether or not damages occur, and determine the location or cause of the damage more quickly and accurately.

In an exemplary embodiment, the structure of the first and second detection lines TL1 and TL2 are not limited to those shown in FIG. 8A. In one exemplary embodiment, for example, the second detection line TL2 may be formed with sub-detection lines of the plurality of layers similar to the second detection line TL2 described above with reference to FIGS. 4A through 4F. In an exemplary embodiment, the second detection line TL2 may include the detection pattern DPL similar to the second detection line TL2 described above with reference to FIG. 5. In an exemplary embodiment, the arrangement/structure of the second detection line TL2 and the location of the detection pattern DPL may be determined based on the location of the bending region BA and the damage occurrence characteristics (e.g., cause/type of the damage, where the damage occurs, etc.) similar to the second detection line TL2 described above with reference to FIGS. 6A through 6C and 7A through 7C.

Figure 8B:
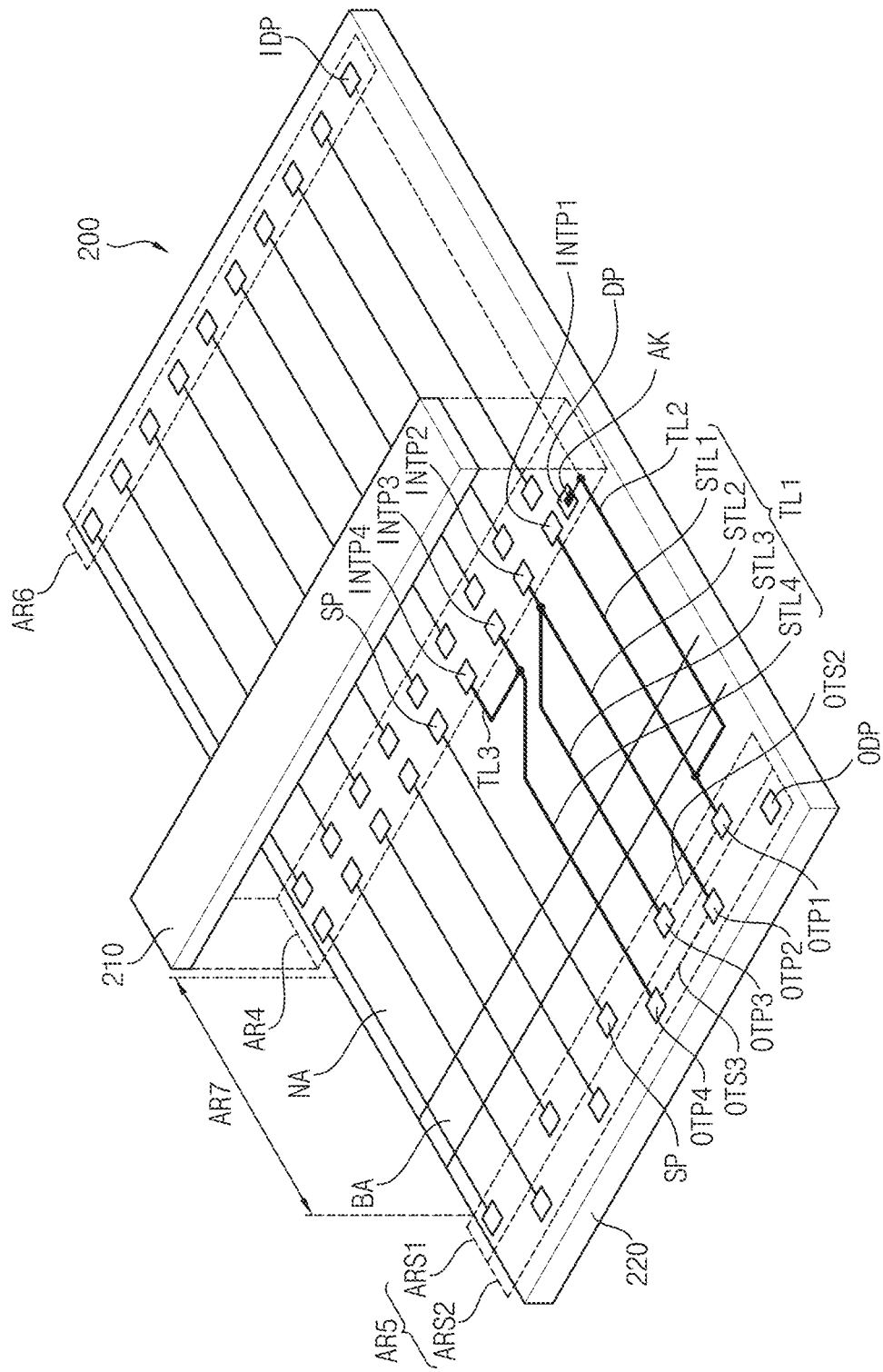
FIG. 8B is a diagram illustrating still another exemplary embodiment of a COF package included in a display device of FIG. 1.

FIG. 8B is a diagram illustrating still another alternative exemplary embodiment of a COF package included in a display device of FIG. 1.

Referring FIGS. 8A and 8B, the COF package 200 of FIG. 8B may be substantially the same as the COF package 200 of FIG. 8A except for the arrangement of the output pads OTP1 through OTP4 and the connection structure of the first detection line TL1. In addition, the arrangement of the output pads OTP1 through OTP4 and the connection structure of the first detection line TL1 may be substantially the same as the arrangement of the output pads OTP1 through OTP4 and the connection structure of the first detection line TL1 shown in FIG. 3B. Therefore, any repetitive detailed description of the same or like elements will hereinafter be omitted or simplified.

In such an embodiment, as described above with reference to FIG. 3B, the IC chip 210 may calculate the first resistance value of the first loop and the second resistance value of the second loop, and may determine whether at least one of the output pads and the bending region is damaged based on the first resistance value and the second resistance value.

In one exemplary embodiment, for example, the IC chip 210 may apply a first test voltage between the first inner pad INTP1 and the third inner pad INTP3, receive a first measured current from the third inner pad INTP3, and calculate a first resistance value of the first loop based on the first test voltage and the first measured current. Here, the first resistance value of the first loop may include resistance values (or compression resistance values, bonding resistance values, contact resistance values) of the first and third inner pads INTP1 and INTP3, resistance values of the first through fourth output pads OTP1 through OTP4, and a resistance value of the first detection line TL1. The first resistance value of the first loop may be calculated by a method substantially the same as or similar to above [Equation 5].

When the first resistance value of the first loop is out of the error range of the reference resistance value (e.g., when the first resistance value is larger than the reference resistance value), the IC chip 210 may determine that the COF package 200 is damaged.

In one exemplary embodiment, for example, the IC chip 210 may apply a fourth test voltage between a third inner pad INTP3 and a fourth inner pad INTP4 to determine that whether the first pad region AR1 is damaged. In such an embodiment, the IC chip 210 may determine whether or not damage occurs in the bending region BA or the like based on Equation 3 described above by applying a second test voltage to the dummy pad DP and the first inner pad INTP1. In such an embodiment, the IC chip 210 may determine whether or not damage occurs in the fifth pad region AR5 based on Equation 3 and Equation 5. In such an embodiment, the IC chip 210 may determine whether or not damage occurs in the first sub-pad region ARS1 and the second sub-pad region ARS2 of the fifth pad region AR5, respectively.

In such an embodiment, as described above with reference to FIG. 8A, the IC chip 210 may continuously detect (or monitor) whether or not the COF package 200 is damaged while the display device 1000 is normally driven. In such an embodiment, the IC chip 210 may transmit the monitoring result to the external device (e.g., the application processor ("AP")), and the external device may control the display device 1000 based on the monitoring result.

Figure 9:
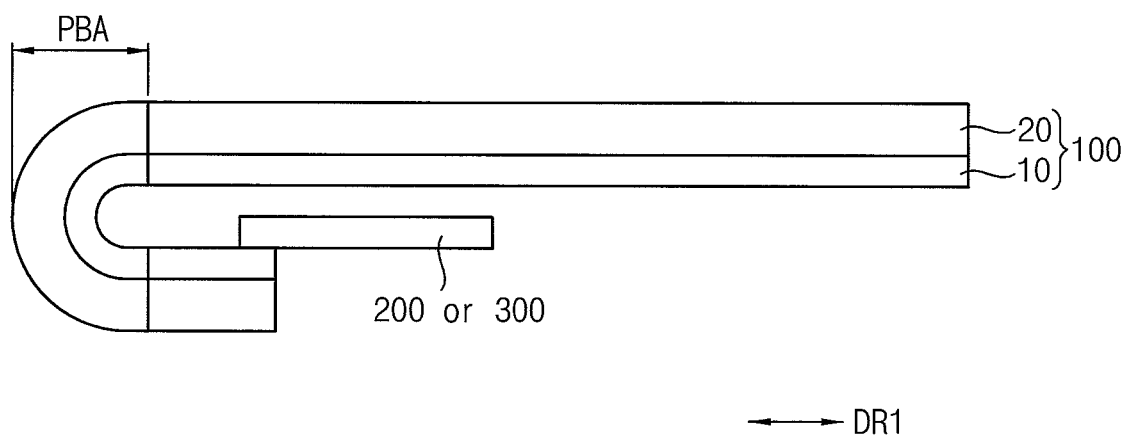
FIG. 9 is a cross-sectional diagram illustrating an exemplary embodiment of a display device of FIG. 1.

FIG. 9 is a cross-sectional diagram illustrating an exemplary embodiment of a display device of FIG. 1.

Referring to FIGS. 1 and 9, an exemplary embodiment of the display device 1000 may include a display panel 100, a COF package 200, and a PCB 300. The display panel 100, the COF package 200, and the PCB 300 are substantially the same as the display panel 100, the COF package 200, and the PCB 300 of the exemplary embodiments described above with reference to FIG. 2, except that the display panel 100 is bent instead of the COF package 200. Therefore, any repetitive detailed description of the same or like elements will hereinafter be omitted or simplified.

The display panel 100 may include a first substrate 10 and a second substrate 20. The first substrate 10 may include a plurality of pixels and a driving circuit (e.g., a gate driver, etc.). The first substrate 10 may a flexible substrate. The second substrate 20 may encapsulate the pixels or the like elements in the first substrate 10, and may include a flexible material. The display panel 100 may be connected to the COF package 200 (or the PCB 300) in a bent state (e.g., in "C" shape).

Figure 10:
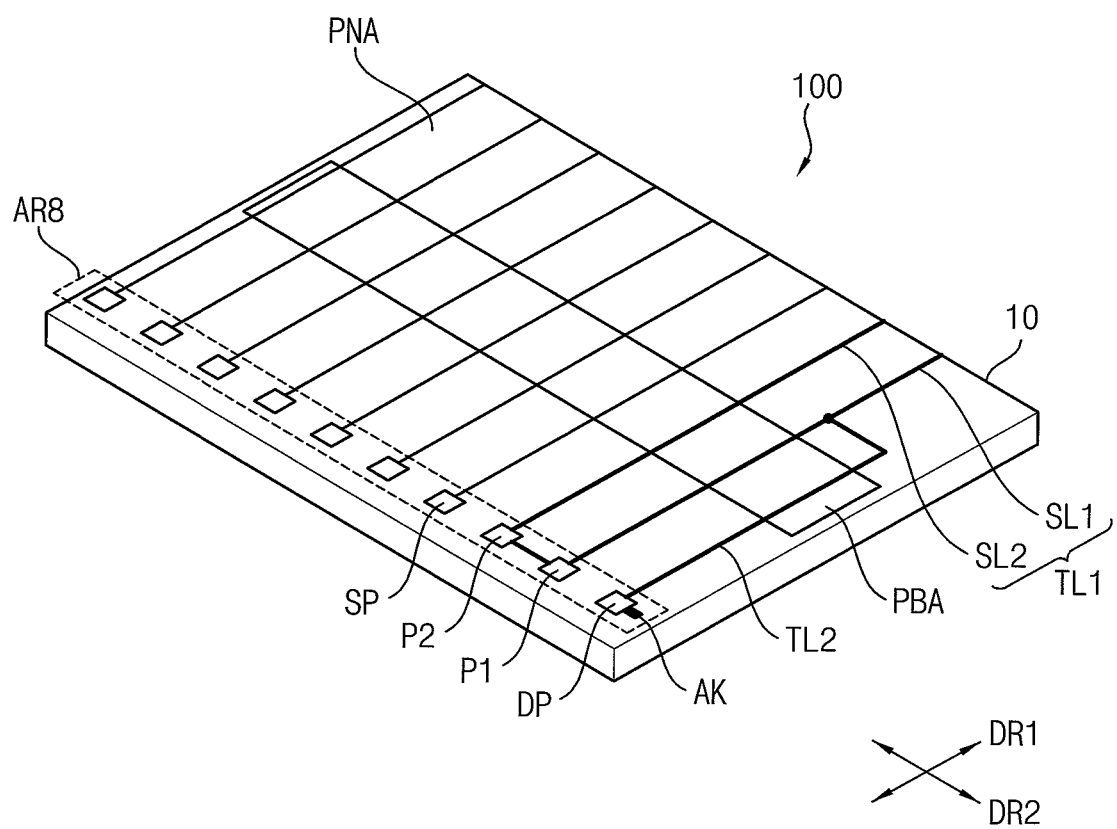
FIG. 10 is a diagram illustrating an exemplary embodiment of a display panel included in a display device of FIG. 9.

FIG. 10 is a diagram illustrating an alternative exemplary embodiment of a display panel included in a display device of FIG. 9.

Referring to FIGS. 9 and 10, an exemplary embodiment of the display panel 100 may include a first substrate 10 (or a base substrate, a base film, a flexible substrate), a plurality of pads (or a plurality of pad electrodes), a first detection line TL1, and a second detection line TL2.

In a plan view, the display panel 100 may include a panel bending region PBA and a panel non-bending region PNA. Similar to the bending region BA described above with reference to FIG. 2, the display panel 100 may be bent in the panel bending region PBA. In one exemplary embodiment, for example, when the display panel 100 is foldable display panel, the foldable display panel may be folded in the panel bending region PDA. The panel bending region PBA may have a constant width in the first direction DR1 and may extend in the second direction DR2. The display panel 100 may not be bent in the panel non-bending region PNA even if the display panel 100 is bent in the panel bending region PBA. That is, the panel non-bending region PNA may be a region excluding the panel bending region PBA in the first substrate 10.

The panel non-bending region PNA may include an eighth pad region AR8. The eighth pad region AR8 may a region for being bonded to the COF package 200 (or, the PCB 300) and may include a dummy pad DP and pads P1, P2. The eighth pad region AR8 may be located at one end of the display panel 100 in the direction DR1.

The first detection line TL1 may be disposed on the first substrate 10 and may be connected to the first pad P1 and the second pad P2. The first detection line TL1 may form a first loop between the first pad P1 and the second pad P2 via a portion of the outer (or edge) of the first substrate 10. The first detection line TL1 may include at least of two straight lines SL1, SL2. Two straight lines SL1, SL2 may be spaced apart from each other in the second direction DR2, and may be extend in the first direction DR1, respectively.

The second detection line TL2 may be disposed on the first substrate 10. The second detection line TL2 may connect the dummy pad DP to the first detection line TL1 via the panel bending region PBA to form a second loop between the dummy pad DP and the first pad P1.

In an exemplary embodiment, the dummy pad DP may include an alignment key AK. In such an embodiment, as described above, the alignment key AK may be used for determining the alignment state of the pads P1, P2 and the signal pads SP or used for determining the alignment state between the COF package 200 and the display panel 100 when the COF package 200 is connected to the display panel 100.

In such an embodiment, as described above with reference to FIG. 3A, it may be determined whether or not the display panel 100 is damaged using the external inspection device. The external inspection device may determine whether the first and second pads P1, P2 and the first detection line TL1 (or, edge portion of the display panel) are damaged using the first pad P1 and the second pad P2. In such an embodiment, the external inspection device may determine whether the panel bending region PBA is damaged using the first pad P1 and the dummy pad DP.

When the first detection line TL1 forms the first loop by connecting other pads or elements other than the pads P1, P2, whether the display panel 100 is damaged may be quickly detected using the first loop, however, the location and cause of the damage may not be effectively detected. In an exemplary embodiment, the display panel 100 further include the second detection line TL2, thereby detecting the damage of the panel bending region PBA more easily.

In such an embodiment, the structure of the first and second detection lines TL1, TL2 is not limited to those shown in FIG. 10. In one exemplary embodiment, for example, the display panel 100 may include pads arranged in two rows, and the first detection line TL1 may be substantially the same as the first detection line TL1 of the example embodiments described above with reference to FIG. 3B. In one exemplary embodiment, for example, similar to the second detection line TL2 shown in FIGS. 4A through 4F, the second detection line TL2 may be formed with sub-detection lines of the plurality of conductive layers, the sub-detection lines disposed on or between the plurality insulating layers. In an exemplary embodiment, similar to the second detection line TL2 shown in FIG. 5, the second detection line TL2 may include the detection pattern DPL. In an exemplary embodiment, similar to the second detection line TL2 shown in FIGS. 6A through 6C and 7A through 7C, the arrangement/structure of the second detection line TL2 and the location of the detection pattern DPL may be determined based on the location of the panel bending region PBA and the damage occurrence characteristics (e.g., cause/type of the damage, where the damage occurs, etc.).

In an exemplary embodiment, the dummy pad and the alignment key may be separated from each other, but not being limited thereto. Alternatively, the dummy pad and the alignment key may be integrally formed. In one exemplary embodiment, for example, the dummy pad include a projection part as the alignment key Although some exemplary embodiments of the COF package, the display panel and the display device have been described with reference to figures, those skilled in the art will readily appreciate that many modifications are possible in the example embodiments without materially departing from the novel teachings and advantages of the invention.

Exemplary embodiments of the invention may be applied to an electronic device having the display device, e.g., a television, a computer monitor, a laptop computer, a cellular phone, a smart phone, a smart pad, a personal digital assistant ("PDA"), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the invention. Accordingly, all such modifications are intended to be included within the scope of the invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A chip-on-film package comprising:
    a base substrate on which a first pad region extends on a first side defining one side of the base substrate, a second pad region extending on a second side defining an opposite side of the base substrate to the one side of the base substrate, a third pad region located between the first pad region and the second pad region, a first region located between the first pad region and the third pad region, and a second region located between the third pad region and the second pad region are defined;
    a plurality of first-pads and a first dummy-pad disposed on the first pad region;
    a plurality of second-pads and a second dummy-pad disposed on the second pad region;
    a plurality of third-pads and a third dummy pad disposed on the third pad region;
    a first detection line disposed on the base substrate, wherein the first detection line includes a first sub-detection line connected between a first third-pad of the third-pads and a first first-pad of the first-pads, a second sub-detection line connected between a second third-pad of the third-pads and a second first-pad of the first-pads, a third sub-detection line connected between the second sub-detection line and a third first-pad of the first-pads, a fourth sub-detection line connected between a third third-pad of the third-pads and a fourth first-pad of the first-pads, and a fifth sub-detection line connected between a fourth third-pad of the third-pads and the fourth sub-detection line, the first first-pad being connected to the third first-pad in the first pad region, and the second first-pad being connected to the fourth first-pad in the first pad region, a second detection line disposed on the base substrate, wherein the second detection line is connected between the third dummy pad and the first sub-detection line;
    wherein the first first-pad is connected to the third first-pad through a short pad in the first pad region and the first dummy-pad is floating.

2. The chip-on-film package of claim 1, wherein the second first-pad is connected to the fourth first-pad through a short pad in the first pad region.

3. The chip-on-film package of claim 1, wherein the second detection line is connected to the first sub-detection line in the first region.

4. The chip-on-film package of claim 1, wherein the third sub-detection line is connected to the second sub-detection line in the first region.

5. The chip-on-film package of claim 1, wherein the fifth sub-detection line is connected to the fourth sub-detection line in the first region.

6. The chip-on-film package of claim 1, wherein the second dummy-pad comprises an alignment key for alignment of the second-pads.

7. The chip-on-film package of claim 1, wherein the third dummy pad comprises an alignment key for alignment of the third-pads.

8. The chip-on-film package of claim 1, wherein the second detection line comprises a detection pattern disposed on the first region in a zigzag pattern.

9. The chip-on-film package of claim 1, wherein the second dummy pad is located in outermost among the second-pads.

10. The chip-on-film package of claim 1, wherein the third dummy pad is located in outermost among the third-pads.

11. The chip-on-film package of claim 1, wherein a first second-pad of the second-pads is electrically connected to the first third-pad of the third-pads via the second pad region, the second region, and the third pad region, and a second second-pad of the second-pads is electrically connected to the second third-pad of the third-pads via the second pad region, the second region, and the third pad region.

12. The chip-on-film package of claim 1, wherein a dummy line is disposed on the substrate, the dummy line being connected between the second dummy-pad and the third dummy-pad via the second pad region, the second region, and the third pad region.

13. The chip-on-film package of claim 1, further comprising:
    an integrated circuit chip connected to the third dummy pad and the third-pads in the third pad region.

14. The chip-on-film package of claim 13, wherein the integrated circuit chip calculates a first resistance value between the first third-pad and the second third-pad and a second resistance value between the second third-pad and the third third-pad and determines whether at least one of the first pad region and the first region is damaged based on the first resistance value and the second resistance value.

15. The chip-on-film package of claim 14, wherein the integrated circuit chip calculates a third resistance value between the third dummy-pad and the first third-pad and a fourth resistance value between the third third-pad and the fourth third-pad and determines whether the first region is damaged based on the third resistance value and the fourth resistance value.

* * * * *